US008520107B2

(12) United States Patent
Nishimura et al.

(10) Patent No.: US 8,520,107 B2
(45) Date of Patent: Aug. 27, 2013

(54) ANALOG-DIGITAL CONVERTER, IMAGE SENSOR SYSTEM AND CAMERA DEVICE

(75) Inventors: Kazuko Nishimura, Kyoto (JP); Makoto Ikuma, Kyoto (JP); Yutaka Abe, Osaka (JP)

(73) Assignee: Panasonic Corporation, Osaka (JP)

( * ) Notice: Subject to any disclaimer, the term of this patent is extended or adjusted under 35 U.S.C. 154(b) by 175 days.

(21) Appl. No.: 13/167,345

(22) Filed: Jun. 23, 2011

(65) Prior Publication Data

US 2011/0254986 A1 Oct. 20, 2011

Related U.S. Application Data

(63) Continuation of application No. PCT/JP2009/005665, filed on Oct. 27, 2009.

(30) Foreign Application Priority Data

Sep. 11, 2009 (JP) ................................. 2009-210946

(51) Int. Cl.
*H04N 3/14* (2006.01)
*H04N 5/217* (2011.01)

(52) U.S. Cl.
USPC ............ 348/294; 348/241; 348/302; 348/304

(58) Field of Classification Search
USPC ................. 348/241, 243, 294, 302, 308, 304, 348/E05.091
See application file for complete search history.

(56) References Cited

U.S. PATENT DOCUMENTS

| | | | | |
|---|---|---|---|---|
| 5,291,139 A | * | 3/1994 | Fruhauf et al. | 324/550 |
| 5,625,308 A | * | 4/1997 | Matsumoto et al. | 327/203 |
| 6,160,424 A | * | 12/2000 | Migliavacca | 327/65 |
| 2003/0141504 A1 | | 7/2003 | Kuwabara et al. | |
| 2004/0070578 A1 | | 4/2004 | Kasai | |
| 2005/0168605 A1 | | 8/2005 | Hiyama et al. | |
| 2007/0216564 A1 | | 9/2007 | Koseki | |
| 2009/0026352 A1 | * | 1/2009 | Shimomura et al. | 250/214 R |
| 2009/0086075 A1 | * | 4/2009 | Saito et al. | 348/308 |
| 2009/0219428 A1 | * | 9/2009 | Nakano et al. | 348/308 |
| 2009/0309775 A1 | | 12/2009 | Ikoma | |
| 2010/0110252 A1 | * | 5/2010 | Shimomura et al. | 348/302 |
| 2011/0001039 A1 | * | 1/2011 | Hoshino | 250/208.1 |

FOREIGN PATENT DOCUMENTS

| | | |
|---|---|---|
| JP | 06-343031 | 12/1994 |
| JP | 06-343031 A | 12/1994 |
| JP | 2001-339492 | 12/2001 |
| JP | 2003-152191 | 5/2003 |
| JP | 2004-088158 | 3/2004 |
| JP | 2004-349814 | 12/2004 |

(Continued)

*Primary Examiner* — Hung Lam
(74) *Attorney, Agent, or Firm* — McDermott Will & Emery LLP

(57) ABSTRACT

An analog-digital converter includes n comparators arranged in a first direction with a predetermined cell pitch and corresponding respectively to n input voltages, each comparator comparing a voltage value of a reference signal whose voltage value increases or decreases over time with an input voltage corresponding to the comparator. Each of the n comparators includes differential transistors to which the reference signal and the input voltage are given respectively. A differential transistor is formed by p unit transistors connected in series whose gates are given the reference signal, and another differential transistor is formed by p unit transistors connected in series whose gates are given the input voltage.

15 Claims, 17 Drawing Sheets

(56) References Cited

FOREIGN PATENT DOCUMENTS

| | | |
|---|---|---|
| JP | 2004349814 A | 12/2004 |
| JP | 2005-217158 | 8/2005 |
| JP | 2007-251325 | 9/2007 |
| JP | 2008-046619 | 2/2008 |
| WO | WO 2006/123446 A1 | 11/2006 |

\* cited by examiner (A)

(B)

ANALOG-DIGITAL CONVERTER, IMAGE SENSOR SYSTEM AND CAMERA DEVICE

CROSS-REFERENCE TO RELATED APPLICATIONS

This is a continuation of PCT International Application PCT/JP2009/005665 filed on Oct. 27, 2009, which claims priority to Japanese Patent Application No. 2009-210946 filed on Sep. 11, 2009. The disclosures of these applications including the specifications, the drawings, and the claims are hereby incorporated by reference in its entirety.

BACKGROUND

The present disclosure relates to an analog-digital converter and an image sensor system having the same, and more particularly to an integration technique for an analog-digital converter.

In a complementary metal-oxide semiconductor (CMOS) image sensor system, an analog-digital converter (e.g., a column ADC) including a plurality of ADC sections corresponding to a plurality of pixel columns of the image sensor is used. An ADC section converts a pixel voltage from a pixel column corresponding to the ADC section to a digital value, and includes, for example, a comparator, a counter, a digital memory, etc.

In such an image sensor system, hundreds or thousands of ADC sections corresponding to pixel columns are arranged with a certain cell pitch. Therefore, an ADC section needs to be formed within the cell pitch. However, with the increase in the demand for reducing the size of an image sensor and increasing the number of pixels thereof in recent years, the cell pitch has become very small, i.e., some μm or less, and there arises a problem that the maximum value of the size of the transistor used in the ADC section is restricted by the cell pitch.

As digital single-lens reflex cameras which are required to have a high speed and a high precision, monitoring/on-vehicle cameras which are required to have a high-sensitivity image even at night, and the like, become widespread, there is a demand for realizing high sensitivity and low noise for an image sensor system. In order to realize these, it is necessary to improve the performance of an analog-digital converter (e.g., increasing the resistance against power supply voltage fluctuations, reducing device variations, reducing noise, etc.), and it is becoming important, as a measure for this, to extend the channel length of a transistor used in an image sensor system (particularly, the ADC section).

As described above, for analog-digital converters, there is a demand for increasing the degree of integration and improving the performance. Note that such an analog converter is applicable not only to image sensor systems but also to other technical fields (e.g., panel drivers such as liquid crystal drivers and PDP drivers).

Japanese Laid-Open Patent Publication No. 2005-217158 (Patent Document 1) is known in the art as an approach to meeting the demands above. In a photoelectric conversion device of Patent Document 1, a plurality of amplification circuits including constant current circuits are arranged in a predetermined repetition direction, and the constant current circuit includes a field effect transistor. The channel length direction of the field effect transistor matches a direction perpendicular to the repetition direction of the amplification circuits. With such a configuration, the channel length of the field effect transistor is extended without being restricted by the cell pitch.

SUMMARY

In recent years, in order to improve the performance of an analog-digital converter, there has also been a demand for not only extending the channel length of a transistor but also extending the channel width of a transistor. For example, in order to improve the comparison precision of a comparator included in an analog-digital converter and increase the speed of the comparator, there is a demand for increasing both the channel length and the channel width of differential transistors included in the comparator, and for increasing the mutual conductance (gm) of the differential transistors.

However, with the technique of Patent Document 1, since the channel length direction of the transistor is matched with the direction perpendicular to the repetition direction of the amplification circuits, the channel width of the transistor is restricted by the cell pitch. Therefore, it is difficult to arbitrarily set both the channel length and the channel width of the transistor. Thus, it is not possible to extend both the channel length and the channel width of the transistor, and it is therefore not possible to improve the performance of the analog-digital converter.

In view of this, an object of the technique disclosed in this specification is to provide an analog-digital converter and an image sensor system with which it is possible to both increase the degree of integration and improve the performance.

According to one aspect of the present invention, an analog-digital converter includes: a reference signal generation circuit for generating a reference signal whose voltage value increases or decreases over time; n (n is an integer of 2 or more) comparators arranged in a first direction with a predetermined cell pitch and corresponding respectively to n input voltages, each comparator comparing the voltage value of the reference signal with the input voltage corresponding to the comparator; n counters corresponding respectively to the n comparators, each counter performing a count operation in synchronism with a predetermined clock so as to output a count value at a point when an output of the comparator corresponding to the counter is inverted; and n digital memories corresponding respectively to the n counters, each digital memory storing the count value output from the counter corresponding to the digital memory, wherein each of the n comparators includes first and second differential transistors to which the reference signal and the input voltage corresponding to the comparator are given, respectively, the first differential transistor is formed by p (p is an integer of 2 or more) first unit transistors connected in series whose gates are given the reference signal, and the second differential transistor is formed by p second unit transistors connected in series whose gates are given the input voltage. With the analog-digital converter, the first and second differential transistors can be formed within the cell pitch of the comparator by dividing the first and second differential transistors into p first unit transistors and p second unit transistors, respectively. Since the channel length and the channel width of the first and second differential transistors can both be set arbitrarily, it is possible to improve the comparison precision of the comparator.

Note that it is preferred that in each of the n comparators, the p first unit transistors and the p second unit transistors are arranged in a second direction perpendicular to the first direction so that a channel length direction thereof matches the first direction, and a channel length of each of the p first unit transistors and the p second unit transistors is shorter than a cell pitch width that is equivalent to a length of the cell pitch in the first direction.

In each of the n comparators, the p second unit transistors may be arranged in line symmetry with the p first unit transistors with respect to a reference line which is a straight line extending in the second direction so as to pass through a reference point within the cell pitch of the comparator. With such a configuration, the differential property of the first and second differential transistors is ensured in each of the n comparators, and it is therefore possible to improve the comparison precision of the comparator.

A k-th ($1 \leq k \leq p$) first unit transistor and a k-th second unit transistor included in each of the n comparators may be arranged along the same straight line in the first direction, and a channel length of each of the p first unit transistors and the p second unit transistors may be shorter than ½ the cell pitch width. With such a configuration, it is possible to reduce characteristics variations between comparators due to the transistor arrangement. It is also possible to reduce the increase in the circuit area of the comparators.

Alternatively, p first unit transistors and p second unit transistors included in each of the n comparators may be arranged so as not to be adjacent in the first direction to any of p first unit transistors and p second unit transistors included in another adjacent comparator. With such a configuration, the channel length of the first and second unit transistors can be extended. Thus, it is possible to extend the channel length of the first and second differential transistors, and to further improve the performance of the comparator.

Alternatively, in each of the n comparators, the p second unit transistors may be arranged in point symmetry with the p first unit transistors with respect to a reference point within the cell pitch of the comparator. With such a configuration, the differential property of the first and second differential transistors is ensured in each of the n comparators, and it is therefore possible to improve the comparison precision of the comparator.

Note that the p first unit transistors may have the same channel length, and the p second unit transistors may have the same channel length. With such a configuration, it is possible to avoid having a wasted area (an area where no device can be formed) on the semiconductor substrate (a semiconductor substrate for forming an analog-digital converter thereon).

Alternatively, the p first unit transistors may have different channel lengths, and the p second unit transistors may have different channel lengths. With such a configuration, it is possible to reduce the number of unit transistors forming each of the first and second differential transistors as compared with a case where the unit transistors have the same channel length.

Each of the n comparators may further include a current source transistor for supplying a reference current to the first and second differential transistors, and the current source transistor may be formed by a plurality of unit transistors connected in series whose gates are given a bias voltage for supplying the reference current. Thus, the current source transistor of the comparator can be formed within the cell pitch of the comparator by dividing the current source transistor of the comparator into a plurality of unit transistors. Since the channel length and the channel width of the current source transistor included in each of the n comparators can both be set arbitrarily, it is possible to increase the resistance against variations of the power supply voltage between the n comparators.

The analog-digital converter may further include n amplifiers arranged in the first direction with a predetermined cell pitch and corresponding respectively to the n input voltages, each amplifier amplifying the input voltage corresponding to the amplifier and supplying the amplified input voltage to the comparator corresponding to the amplifier, wherein each of the n amplifiers may include a current source transistor for supplying a predetermined current, and the current source transistor included in each of the n amplifiers may be formed by a plurality of unit transistors connected in series whose gates are given a bias voltage for supplying the predetermined current. Thus, the current source transistor of the amplifier can be formed within the cell pitch of the amplifier by dividing the current source transistor of the amplifier into a plurality of unit transistors. The channel length and the channel width of the current source transistor included in each of the n amplifiers can be set arbitrarily, and it is therefore possible to increase the resistance against variations of the power supply voltage between the n amplifiers.

According to another aspect of the present invention, an image sensor system includes: n×m pixel portions arranged in a two-dimensional matrix of n columns by m rows, each pixel portion generating a charge according to an amount of incident light thereupon; a vertical scanning circuit for selecting the n×m pixel portions row by row; n readout circuits corresponding respectively to n pixel columns of the n×m pixel portions, each readout circuit generating a pixel voltage according to the charge generated by one of the n pixel portions selected by the vertical scanning circuit that corresponds to the readout circuit; the analog-digital converter of claim 1 for converting the n pixel voltages generated by the n readout circuits to n digital values; and a horizontal scanning circuit for successively transferring the n digital values obtained by the analog-digital converter as captured data. With the image sensor system, since it is possible to both increase the degree of integration of the analog-digital converter and improve the performance thereof, it is possible to increase the number of pixels of the image sensor and to accurately supply high-definition captured data.

Note that each of the n readout circuits may include a current source transistor which forms a source follower circuit together with a pixel portion corresponding to the readout circuit, and the current source transistor included in each of the n readout circuits may be formed by a plurality of unit transistors connected in series whose gates are given a reference voltage for supplying a readout current. Thus, the current source transistor of the readout circuit can be formed within the cell pitch of the readout circuit by dividing the current source transistor of the readout circuit into a plurality of unit transistors. The channel length and the channel width of the current source transistor included in each of the n readout circuits can be set arbitrarily, and it is therefore possible to increase the resistance against variations of the power supply voltage between the n readout circuits.

According to another aspect of the present invention, an analog-digital converter includes: a reference signal generation circuit for generating a reference signal whose voltage value increases or decreases over time; n comparators arranged in a first direction with a predetermined cell pitch and corresponding respectively to n input voltages, each comparator comparing a voltage value of a reference signal with an input voltage corresponding to the comparator; n counters corresponding respectively to the n comparators, each counter performing a count operation in synchronism with a predetermined clock so as to output a count value at a point when an output of the comparator corresponding to the counter is inverted; and n digital memories corresponding respectively to the n counters, each digital memory storing the count value output from the counter corresponding to the digital memory, wherein each of the n comparators includes a current source transistor for supplying a reference current, and the current source transistor is formed by a plurality of unit transistors connected in series whose gates are given a bias voltage for supplying the reference current. With the analog-digital converter, the current source transistor of the comparator can be formed within the cell pitch of the comparator by dividing the current source transistor of the comparator into a plurality of unit transistors. The channel length and the channel width of the current source transistor included in each of the n comparators can both be set arbitrarily, and it is therefore possible to increase the resistance against variations of the power supply voltage between the n comparators.

According to another aspect of the present invention, an analog-digital converter includes: a reference signal generation circuit for generating a reference signal whose voltage value increases or decreases over time; n amplifiers arranged in a first direction with a predetermined cell pitch and corresponding respectively to n input voltages, each amplifier amplifying an input voltage corresponding to the amplifier; n comparators corresponding respectively to the n amplifiers, each comparator comparing a voltage value of the reference signal with an input voltage which has been amplified by the amplifier corresponding to the comparator; n counters corresponding respectively to the n comparators, each counter performing a count operation in synchronism with a predetermined clock so as to output a count value at a point when an output of the comparator corresponding to the counter is inverted; and n digital memories corresponding respectively to the n counters, each digital memory storing the count value output from the counter corresponding to the digital memory, wherein each of the n amplifiers includes a current source transistor for supplying a predetermined current, and the current source transistor is formed by a plurality of unit transistors connected in series whose gates are given a bias voltage for supplying the predetermined current. With the analog-digital converter, the current source transistor of the amplifier can be formed within the cell pitch of the amplifier by dividing the current source transistor of the amplifier into a plurality of unit transistors. The channel length and the channel width of the current source transistor included in each of the n amplifiers can be set arbitrarily, and it is therefore possible to increase the resistance against variations of the power supply voltage between the n amplifiers.

According to another aspect of the present invention, an image sensor system includes: n×m pixel portions arranged in a two-dimensional matrix of n columns by m rows, each pixel portion generating a charge according to an amount of incident light thereupon; a vertical scanning circuit for selecting the n×m pixel portions row by row; n readout circuits corresponding respectively to n pixel columns of the n×m pixel portions, each readout circuit generating a pixel voltage according to the charge generated by one of the n pixel portions selected by the vertical scanning circuit that corresponds to the readout circuit; an analog-digital converter for converting the n pixel voltages generated by the n readout circuits to n digital values; and a horizontal scanning circuit for successively transferring the n digital values obtained by the analog-digital converter as captured data, wherein each of the n readout circuits includes a current source transistor which forms a source follower circuit together with a pixel portion corresponding to the readout circuit, and the current source transistor is formed by a plurality of unit transistors connected in series whose gates are given a reference voltage for supplying a readout current. With the image sensor system, the current source transistor of the readout circuit can be formed within the cell pitch of the readout circuit by dividing the current source transistor of the readout circuit into a plurality of unit transistors. The channel length and the channel width of the current source transistor included in each of the n readout circuits can be set arbitrarily, and it is therefore possible to increase the resistance against variation of the power supply voltage between the n readout circuits.

According to another aspect of the present invention, a semiconductor integrated circuit includes: a plurality of unit transistors formed on a semiconductor substrate, wherein two or more of the plurality of unit transistors are connected in series and/or connected in parallel, thereby forming a transistor having an intended channel length and an intended channel width. With the semiconductor integrated circuit, by providing a plurality of unit transistors, it is possible to freely set the channel length and the channel width of the transistor formed by two or more unit transistors, thus improving the degree of freedom in design.

DETAILED DESCRIPTION

Figure 1:
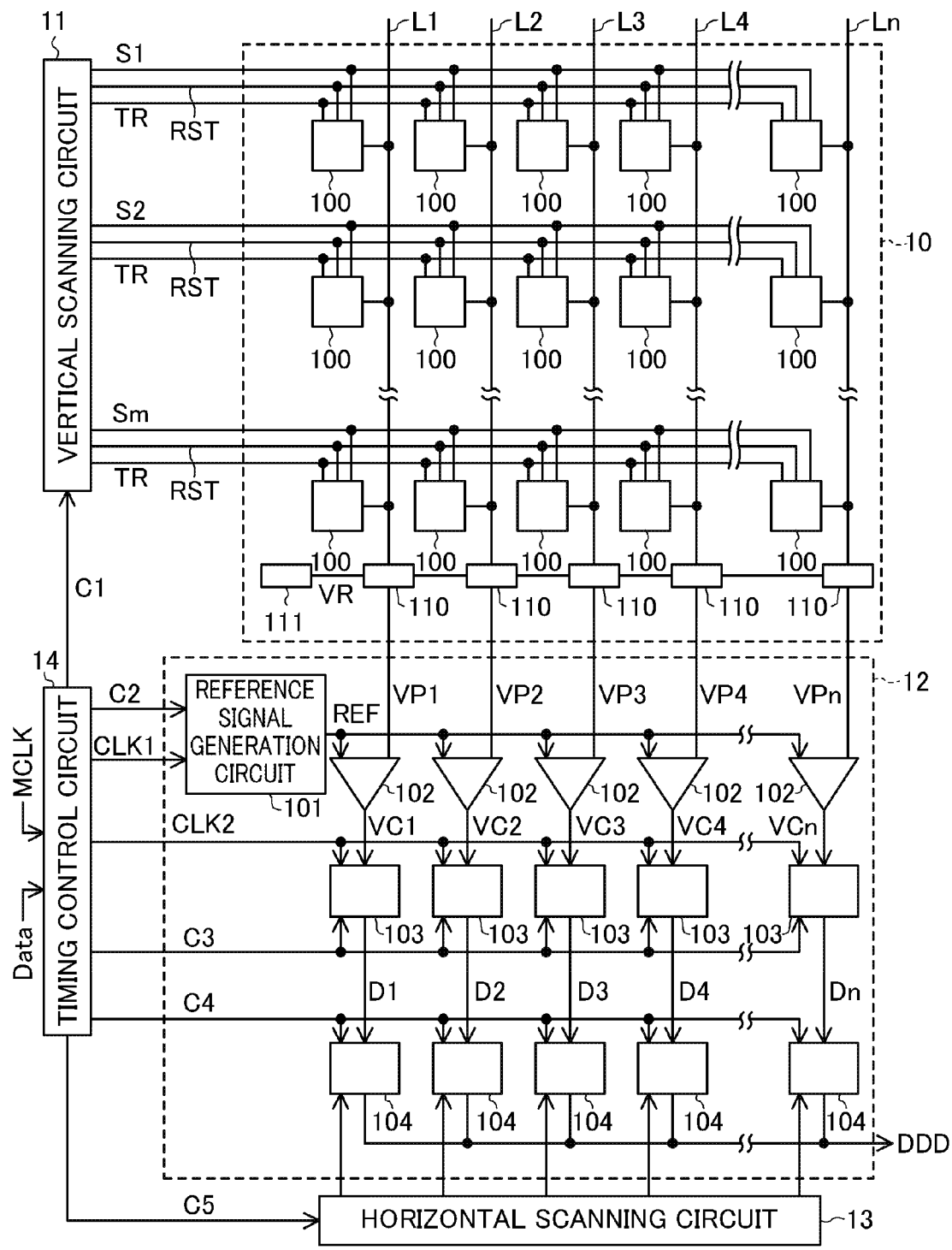
FIG. 1 is a diagram showing a configuration example of an image sensor system of Embodiment 1.

Embodiments will now be described in detail with reference to the drawings. Note that like elements are denoted by like reference numerals throughout the figures, and will not be described repeatedly.

(Embodiment 1)

FIG. 1 shows a configuration example of an image sensor system of Embodiment 1. An image sensor system 1 includes an image sensor 10, a vertical scanning circuit 11, an analog-digital converter 12, a horizontal scanning circuit 13, and a timing control circuit 14.

The image sensor 10 includes n×m pixel portions 100, 100, ..., 100 arranged in a two-dimensional matrix pattern of n columns by m rows (n and m are integers of 2 or more), n readout circuits 110, 110, ..., 110 arranged in a predetermined repetition direction (e.g., the row direction of the image sensor 10) with a predetermined cell pitch (e.g., the pixel pitch), and a bias circuit 111. Each of the n×m pixel portions 100, 100, ..., 100 generates a charge according to the amount of incident light thereupon. The vertical scanning circuit 11 outputs m row selection signals S1, S2, ..., Sm one by one in response to a control signal C1, thereby selecting the pixel portions 100, 100, ..., 100 row by row. The readout circuits 110, 110, ..., 110 correspond respectively to n pixel columns of the n×m pixel portions (i.e., n column signal lines L1, L2, ..., Ln), and generate pixel voltages VP1, VP2, ..., VPn according to the charge generated by one of the n pixel portions 100, 100, ..., 100 selected by the vertical scanning circuit 11 that corresponds to the readout circuit 110.

[Configuration Example of Pixel Portion, Readout Circuit, Bias Circuit]

Figure 2:
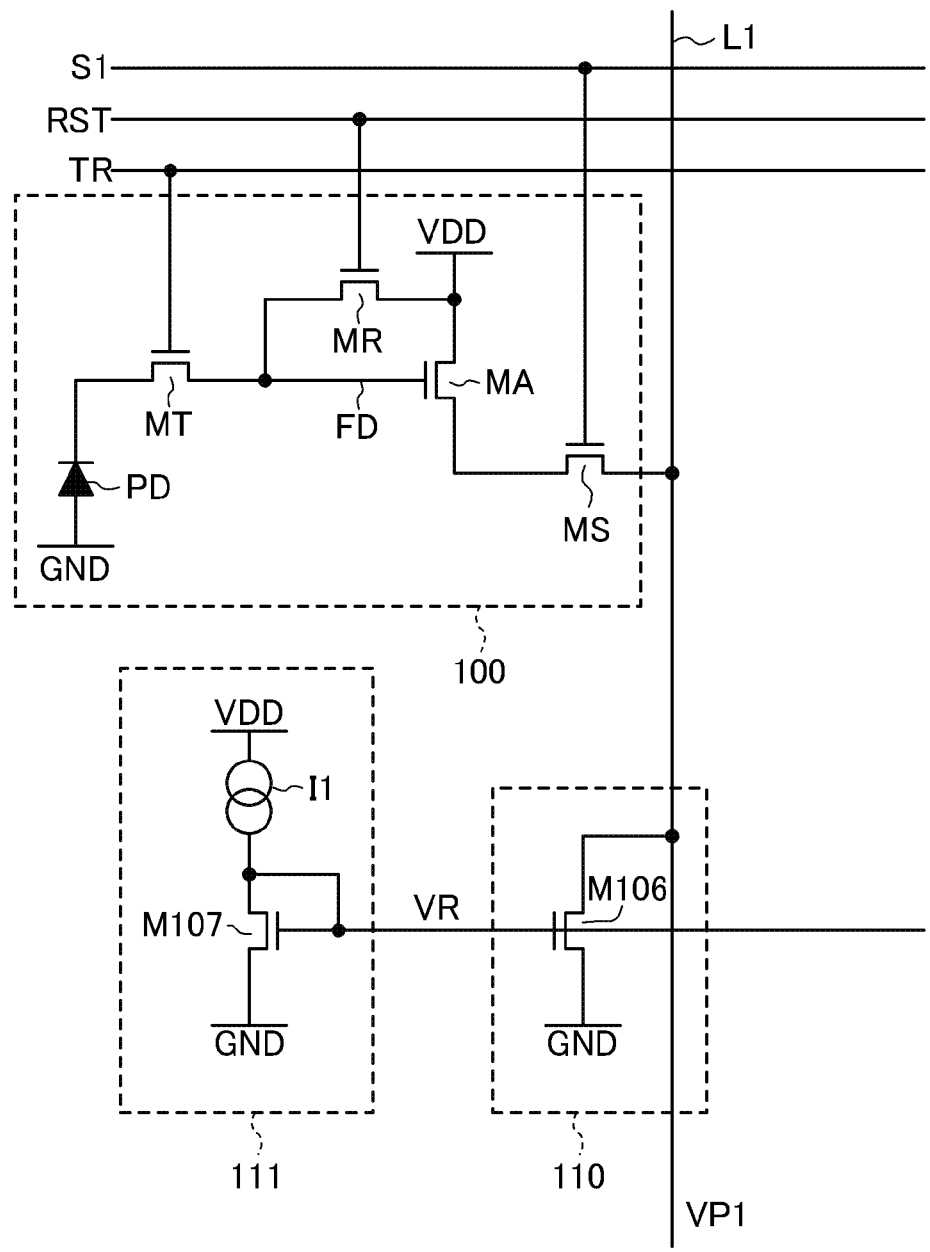
FIG. 2 is a diagram illustrating a configuration example of a pixel portion, a readout circuit and a bias circuit shown in FIG. 1.

For example, as shown in FIG. 2, each of the pixel portions 100, 100, ..., 100 includes a photodiode PD, a transfer transistor MT, a reset transistor MR, an amplification transistor MA, and a switch transistor MS, each of the readout circuits 110, 110, ..., 110 includes a current source transistor M106, and the bias circuit 111 includes a current source I1 and a current mirror transistor M107. The current source transistor M106 receives a reference voltage VR from the bias circuit 111 supplied to the gate thereof, and supplies a readout current according to the reference voltage VR to a column signal line (the column signal line L1 in FIG. 2). The current mirror transistor M107 forms a current mirror circuit together with the current source transistor M106 which is included in each of the readout circuits 110, 110, 110, and outputs the reference voltage VR according to the current from the current source I1.

[Pixel Voltage Readout Operation]

Referring now to FIG. 2, an operation of reading out the pixel voltages VP1, VP2, ..., VPn will be described. First, the vertical scanning circuit 11 outputs the row selection signal S1 to turn ON the switch transistor MS. Thus, in each of the n pixel portions 100, 100, ..., 100 to which the row selection signal S1 is supplied, the drain of the amplification transistor MA is connected to the source of the current source transistor M106 included in the readout circuit corresponding to the pixel portion. That is, the amplification transistor MA included in each of the n pixel portions 100, 100, ..., 100 selected by the vertical scanning circuit 11, and the current source transistor M106 included in the readout circuit corresponding to the pixel portion together form a source follower circuit. In this state, the vertical scanning circuit 11 outputs a reset signal RST to turn ON the reset transistor MR. Thus, the voltage of a floating diffusion portion FD (the gate node of the amplification transistor MA) is initialized. Then, when light enters the photodiode PD, the photodiode PD generates a charge according to the amount of incident light thereupon. The vertical scanning circuit 11 outputs a transfer signal TR to turn ON the transfer transistor MT. Thus, the charge generated by the photodiode PD is transferred to the floating diffusion portion FD. Thus, the pixel voltage VP1 is generated on the column signal line L1 according to the charge transferred to the floating diffusion portion FD and the readout current of the current source transistor M106. Similarly, the pixel voltages VP2, VP3, ..., VPn are generated on column signal lines L2, L3, ..., Ln, respectively, according to the charge of the floating diffusion portion FD and the readout current of the current source transistor M106.

Note that in each of the pixel portions 100, 100, ..., 100, the transfer transistor MT may be absent, and the charge generated by the photodiode PD may be given directly to the floating diffusion portion FD. Each of the pixel portions 100, 100, ..., 100 does not have to include the switch transistor MS. In such a case, the vertical scanning circuit 11 may control the transfer signal TR and the reset signal RST for each of the m pixel rows of the n×m pixel portions 100, 100, ..., 100 so that the n×m pixel portions 100, 100, ..., 100 are selected row by row (i.e., so that charges of n pixel portions 100, 100, ..., 100 are transferred to the column signal lines L1, L2, ..., Ln, respectively).

[Analog-Digital Converter]

Referring back to FIG. 1, the analog-digital converter 12 converts the pixel voltages (input voltages) VP1, VP2, ..., VPn supplied via the column signal lines L1, L2, ..., Ln to digital values D1, D2, ..., Dn, respectively, and includes a reference signal generation circuit 101, n comparators 102, 102, ..., 102, n counters 103, 103, ..., 103, and n digital memories 104, 104, ..., 104. The reference signal generation circuit 101 generates a reference signal REF whose voltage value increases (or decreases) over time (e.g., a ramp wave, or the like). For example, the reference signal generation circuit 101 starts outputting the reference signal REF in response to a control signal C2, and gradually increases (or decreases) the voltage value of the reference signal REF in synchronism with a clock CLK1. The n comparators 102, 102, ..., 102 are arranged in a predetermined repetition direction (e.g., in the row direction of the image sensor 10) with a predetermined cell pitch. The n comparators 102, 102, ..., 102 correspond respectively to the n pixel voltages VP1, VP2, ..., VPn, and each compare the voltage value of the reference signal REF with one of the pixel voltages VP1, VP2, ..., VPn corresponding to the comparator 102. The n counters 103, 103, ..., 103 correspond respectively to the n comparators 102, 102, ..., 102, and are given output voltages VC1, VC2, ..., VCn of n comparators, respectively. The counters 103, 103, ..., 103 each start a count operation (count up or count down) in synchronism with a clock CLK2 in response to a control signal C3, and output, as the digital values D1, D2, ..., Dn, the count value at a point when the output voltage of the comparator 102 corresponding to the counter is inverted. The digital memories 104, 104, ..., 104 correspond respectively to the n counters 103, 103, ..., 103, and hold the digital values D1, D2, ..., Dn from the n counters 103, 103, ..., 103 in response to a control signal C4.

[Horizontal Scanning Circuit]

The horizontal scanning circuit 13 selects the digital memories 104, 104, ..., 104 one by one in response to a control signal C5, thereby transferring the digital values D1, D2, ..., Dn stored respectively in the digital memories 104, 104, ..., 104 as captured data DDD.

[Timing Control Circuit]

The timing control circuit 14 controls the vertical scanning circuit 11, the reference signal generation circuit 101, the counters 103, 103, ..., 103, the digital memories 104, 104, ..., 104, and the horizontal scanning circuit 13 by the control signals C1, C2, C3, C4 and C5. For example, the timing control circuit 14 controls the operation of the vertical scanning circuit 11 by the control signal C1 so that the vertical scanning circuit 11 outputs the transfer signal TR, the reset signal RST and the row selection signals S1, S2, ..., Sn with appropriate timing. The timing control circuit 14 outputs the clocks CLK1 and CLK2.

[General Layout]

Figure 3:
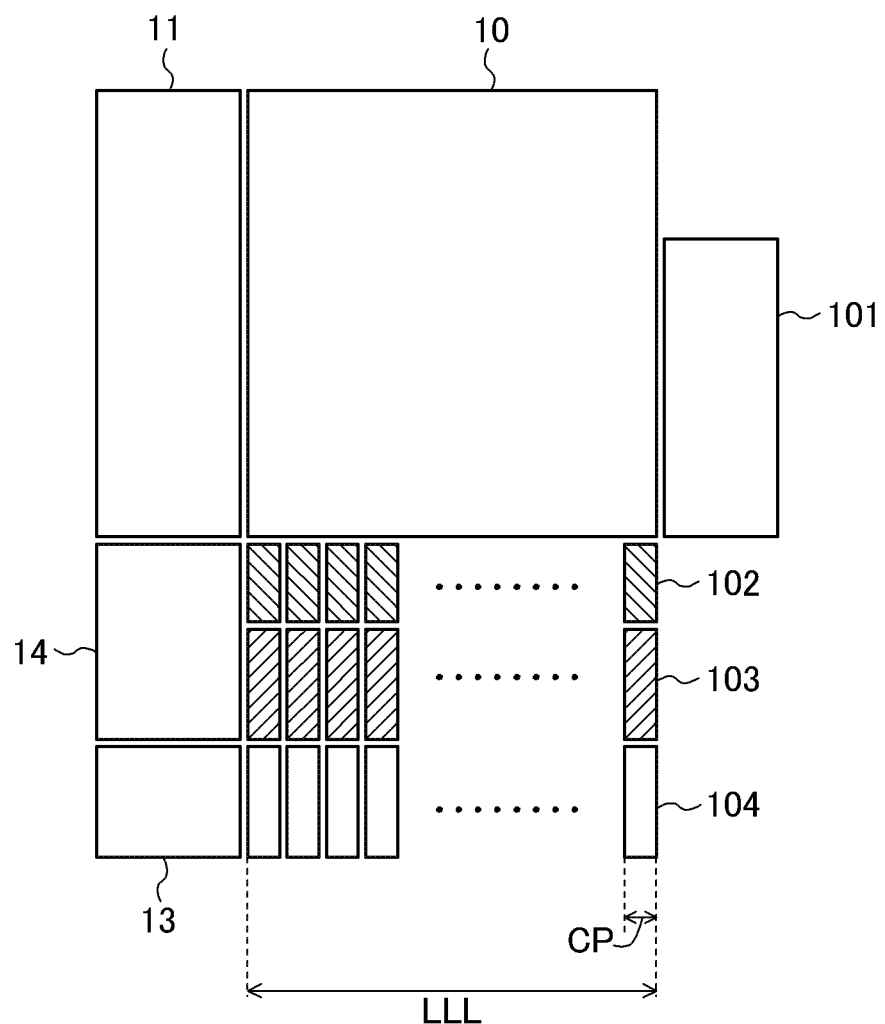
FIG. 3 is a diagram showing a general layout of the image sensor system shown in FIG. 1.

FIG. 3 shows an example of a general layout of the image sensor system shown in FIG. 1. As shown in FIG. 3, the comparators 102, 102, ..., 102 are arranged repeatedly in the row direction of the image sensor 10. The cell pitch width CP (the length of the cell pitch of the comparator 102 in the repetition direction) is determined by the pixel pitch of the image sensor 10. For example, the cell pitch width CP of the comparator 102 equals to the length obtained by dividing a total cell length LLL by the number of columns of the image sensor 10 (i.e., the number of comparators). Where one comparator 102 is placed over q (q is an integer of 2 or more) pixel columns, the length obtained by dividing the total cell length LLL by "the number of columns of the image sensor 10/q (i.e., the number of comparators/q)" may be used as the cell pitch of the comparator 102. Note that the analog-digital converter 12 may be provided at opposite ends of the image sensor 10 (i.e., at opposite ends of the column signal lines L1, L2, ..., Ln).

[Comparator]

Figure 4:
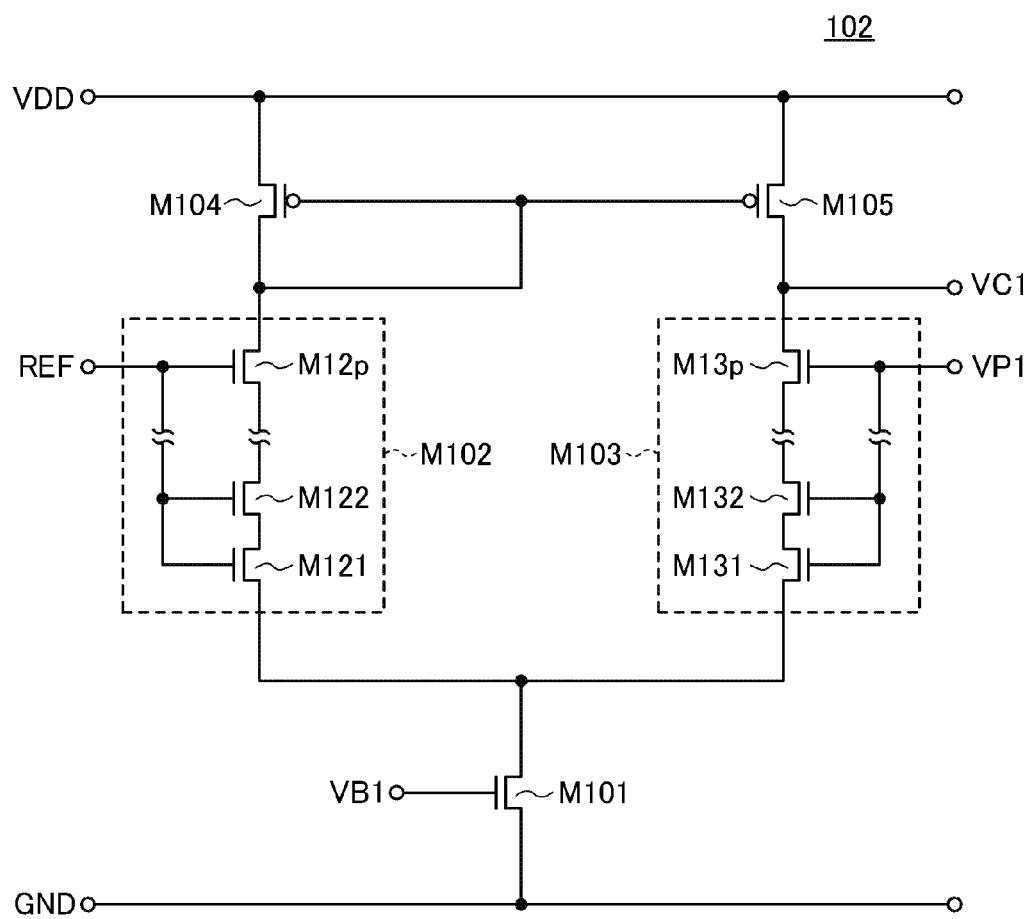
FIG. 4 is a diagram showing a configuration example of a comparator shown in FIG. 1.

FIG. 4 shows a configuration example of the comparator 102 shown in FIG. 1. The comparator 102 includes a current source transistor M101, differential transistors M102 and M103, and load transistors M104 and M105.

The current source transistor M101 supplies the reference current to the differential transistors M102 and M103. The source of the current source transistor M101 is connected to the ground node to which the ground voltage GND is given, and a bias voltage VB1 for supplying the reference current is given to the gate of the current source transistor M101.

The differential transistors M102 and M103 are given the reference signal REF, and the input voltage corresponding to the comparator 102 (here, the input voltage VP1), respectively. The differential transistor M102 is formed by p (p is an integer of 2 or more) unit transistors M121, M122, ..., M12p. The unit transistors M121, M122, ..., M12p are connected in series between the drain of the current source transistor M101 and the drain of the load transistor M104, and the reference signal REF is given to the gates thereof. Similarly, the differential transistor M103 is formed by p unit transistors M131, M132, ..., M13p connected in series whose gates are given the input voltage VP1. The sources of the differential transistors M102 and M103 (here, the sources of the unit transistors M121 and M131) are connected to the drain of the current source transistor M101. Note that the input voltage VP1 may be given to the gate of the differential transistor M102 (the gates of the unit transistors M121, M122, ..., M12p), and the reference signal REF to the gate of the differential transistor M103 (the gates of the unit transistors M131, M132, ..., M13p).

The sources of the load transistors M104 and M105 are connected to the power supply node to which the power supply voltage VDD is given, and the drains of the load transistors M104 and M105 are connected respectively to the drains of the differential transistors M102 and M103 (here, the drains of the unit transistors M12p and M13p). The gate of the load transistor M104 is connected to the gate of the load transistor M105, and the drain of the load transistor M104. That is, the load transistors M104 and M105 together form a current mirror circuit. Note that the gate of the load transistor M104 may not be connected to the drain of the load transistor M104, and the bias voltage may be given to the gates of the load transistors M104 and M105. Alternatively, instead of the load transistors M104 and M105, the comparator 102 may include a resistive element connected between the power supply node and the drain of the differential transistor M102, and a resistive element connected between the power supply node and the drain of the differential transistor M103. Thus, the comparator 102 may have a configuration of a fully-differential type.

[Transistor Characteristics]

Figure 5:
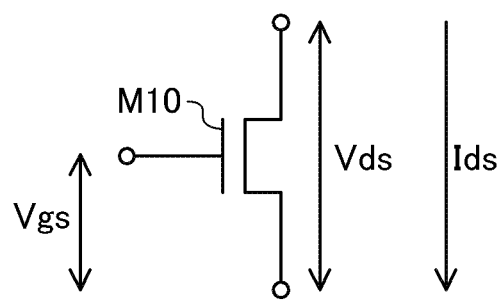
FIG. 5 is a diagram illustrating transistor characteristics.
Figure 5:
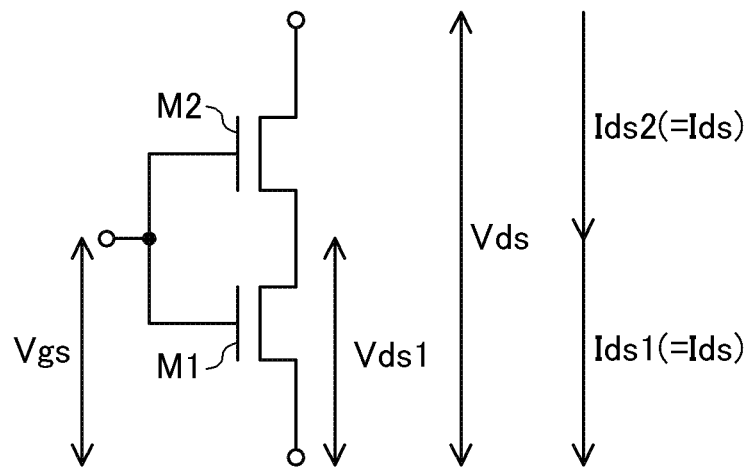

Referring now to FIGS. 5A and 5B, the transistor characteristics of the unit transistors M121, M122, ..., M12p and the unit transistors M131, M132, ..., M13p shown in FIG. 4 will be described.

<<nMOS Transistor M10>>

First, the transistor characteristics of the nMOS transistor M10 shown in FIG. 5A will be described. In FIG. 5A, Vgs, Vds and Ids denote the gate-source voltage, the drain-source voltage, and the drain-source current of the nMOS transistor M10.

(1) Saturation Region

Where the nMOS transistor M10 operates in the saturation region (Vgs<Vds+Vt), the drain-source current Ids is expressed as shown in (Expression A) below.

$$Ids = \tfrac{1}{2} \cdot \mu \cdot Cox \cdot W/L \cdot (Vgs - Vt)^2 \qquad \text{(Expression A)}$$

(2) Non-Saturation Region

On the other hand, where the nMOS transistor M10 operates in the non-saturation region (Vgs≧Vds+Vt), the drain-source current Ids is expressed as shown in (Expression B) below.

$$Ids = \mu \cdot Cox \cdot W/L \cdot \{(Vgs - Vt) \cdot Vds - \tfrac{1}{2} \cdot Vds^2\} \qquad \text{(Expression B)}$$

Note that "Vt" denotes the threshold voltage of the nMOS transistor M10, "W/L" the channel width /channel length of the nMOS transistor M10, "μ" the carrier mobility, and "Cox" the gate oxide film. Note however that the channel length modulation coefficient λ and the substrate bias effect coefficient γ are ignored for the sake of simplicity.

<<nMOS Transistors M1 and M2, Part 1>>

Referring now to FIG. 5B, the transistor characteristics of the nMOS transistors M1 and M2 connected in series will be described. In FIG. 5B, Vgs, Vds1 and Ids1 denote the gate-source voltage, the drain-source voltage and the drain-source current, respectively, of the nMOS transistor M1, Ids2 the drain-source current of the nMOS transistor M2, and Vds the voltage between the source of the nMOS transistor M1 and the drain of the nMOS transistor M2. Note that it is assumed herein that the channel width/channel length of each of the nMOS transistors M1 and M2 is W/(L/2). That is, it is assumed that the channel length of the nMOS transistors M1 and M2 is ½ the channel length of the nMOS transistor M10. In such a case, the nMOS transistor M1 always operates in the non-saturation region (Vgs≧Vds1+Vt).

(1) Saturation Region

Where the nMOS transistor M2 operates in the saturation region ((Vgs−Vds1)<{(Vds−Vds1)+Vt}), the drain-source currents Ids1 and Ids2 are expressed as shown in (Expression 1) and (Expression 2) below.

$$Ids1 = \mu \cdot Cox \cdot W/(L/2) \cdot \{(Vgs - Vt) \cdot Vds1 - \tfrac{1}{2} \cdot Vds1^2\} \qquad \text{(Expression 1)}$$

$$Ids2 = \tfrac{1}{2} \cdot \mu \cdot Cox \cdot W/(L/2) \cdot (Vgs - Vds1 - Vt)^2 \qquad \text{(Expression 2)}$$

Here, since Ids1=Ids2, (Expression 3) below is obtained from (Expression 1) and (Expression 2).

$$(Vgs - Vt) \cdot Vds1 - \tfrac{1}{2} \cdot Vds1^2 = \tfrac{1}{4} \cdot (Vgs - Vt)^2 \qquad \text{(Expression 3)}$$

(Expression 4) below is obtained by substituting (Expression 3) into (Expression 1).

$$Ids1 = \tfrac{1}{2} \cdot \mu \cdot Cox \cdot W/L \cdot (Vgs - Vt)^2 \qquad \text{(Expression 4)}$$

Thus, the transistor characteristics expression (Expression 4) where the nMOS transistor M2 operates in the saturation region is equal to the transistor characteristics expression (Expression A) where the MOS transistor M10 operates in the saturation region.

(2) Non-Saturation Region

On the other hand, where the nMOS transistor M2 operates in the non-saturation region ((Vgs−Vds1)≧{(Vds−Vds1)+Vt}), the drain-source currents Ids1 and Ids2 are expressed as shown in (Expression 5) and (Expression 6) below.

$$Ids1=\mu \cdot Cox \cdot W/(L/2) \cdot \{(Vgs-Vt) \cdot Vds1 - \tfrac{1}{2} \cdot Vds1^2\} \quad \text{(Expression 5)}$$

$$Ids2=\mu \cdot Cox \cdot W/(L/2) \cdot \{(Vgs-Vds1-Vt) \cdot (Vds-Vds1) - \tfrac{1}{2} \cdot (Vds-Vds1)^2\} \quad \text{(Expression 6)}$$

Here, since Ids1=Ids2, (Expression 7) below is obtained from (Expression 5) and (Expression 6).

$$(Vgs-Vt) \cdot Vds1 - \tfrac{1}{2} \cdot Vds1^2 = \tfrac{1}{2} \cdot \{(Vgs-Vt) \cdot Vds - \tfrac{1}{2} \cdot Vds^2\} \quad \text{(Expression 7)}$$

(Expression 8) below is obtained by substituting (Expression 7) into (Expression 5).

$$Ids1=\mu \cdot Cox \cdot W/L \cdot \{(Vgs-Vt) \cdot Vds - \tfrac{1}{2} \cdot Vds^2\} \quad \text{(Expression 8)}$$

Thus, the transistor characteristics expression (Expression 8) where the nMOS transistor M2 operates in the non-saturation region is equal to the transistor characteristics expression (Expression B) where the nMOS transistor M10 operates in the non-saturation region.

<<nMOS Transistors M1 and M2, Part 2>>

Note that the nMOS transistors M1 and M2 may have different W/L values from each other. Here, an example where the channel width/channel length values of the nMOS transistors M1 and M2 are W/(L/3) and W/(2L/3), respectively, in FIG. 5B (i.e., an example where the channel lengths of the nMOS transistors M1 and M2 are ⅓ and ⅔, respectively, of the channel length of the nMOS transistor M10) will be described.

(1) Saturation Region

Where the nMOS transistor M2 operates in the saturation region, the drain-source currents Ids1 and Ids2 are expressed as shown in (Expression 11) and (Expression 12) below.

$$Ids1=\mu \cdot Cox \cdot W/(2L/3) \cdot \{(Vgs-Vt) \cdot Vds1 - \tfrac{1}{2} \cdot Vds1^2\} \quad \text{(Expression 11)}$$

$$Ids2=\tfrac{1}{2} \cdot \mu \cdot Cox \cdot W/(L/3) \cdot (Vgs-Vds1-Vt)^2 \quad \text{(Expression 12)}$$

Here, since Ids1=Ids2, (Expression 13) below is obtained from (Expression 11) and (Expression 12).

$$(Vgs-Vt) \cdot Vds1 - \tfrac{1}{2} \cdot Vds1^2 = \tfrac{1}{3} \cdot (Vgs-Vt)^2 \quad \text{(Expression 13)}$$

(Expression 14) below is obtained by substituting (Expression 13) into (Expression 11).

$$Ids1=\tfrac{1}{2} \cdot \mu \cdot Cox \cdot W/L \cdot (Vgs-Vt)^2 \quad \text{(Expression 14)}$$

Thus, the transistor characteristics expression (Expression 14) where the nMOS transistor M2 operates in the saturation region is equal to the transistor characteristics expression (Expression A) where the nMOS transistor M10 operates in the saturation region.

(2) Non-Saturation Region

On the other hand, where the nMOS transistor M2 operates in the non-saturation region, the drain-source currents Ids1 and Ids2 are expressed as shown in (Expression 15) and (Expression 16) below.

$$Ids2=\mu \cdot Cox \cdot W/(2L/3) \cdot \{(Vgs-Vt) \cdot Vds1 - \tfrac{1}{2} \cdot Vds1^2\} \quad \text{(Expression 15)}$$

$$Ids1=\mu \cdot Cox \cdot W/(L/3) \cdot \{(Vgs-Vds1-Vt) \cdot (Vds-Vds1) - \tfrac{1}{2} \cdot (Vds-Vds1)^2\} \quad \text{(Expression 16)}$$

Here, since Ids1=Ids2, (Expression 17) below is obtained from (Expression 15) and (Expression 16).

$$(Vgs-Vt) \cdot Vds1 - \tfrac{1}{2} \cdot Vds1^2 = \tfrac{2}{3} \cdot \{(Vgs-Vt) \cdot Vds - \tfrac{1}{2} \cdot Vds^2\} \quad \text{(Expression 17)}$$

(Expression 18) below is obtained by substituting (Expression 17) into (Expression 15).

$$Ids1=\mu \cdot Cox \cdot W/L \cdot \{(Vgs-Vt) \cdot Vds - \tfrac{1}{2} \cdot Vds^2\} \quad \text{(Expression 18)}$$

Thus, the transistor characteristics expression (Expression 18) where the nMOS transistor M2 operates in the non-saturation region is equal to the transistor characteristics expression (Expression B) where the nMOS transistor M10 operates in the non-saturation region.

Note that although not illustrated here, transistor characteristics similar to those of the nMOS transistor M10 are exhibited also when the channel lengths of the nMOS transistors M1 and M2 are set to ⅔ and ⅓, respectively, of the channel length of the nMOS transistor M10 (when the nMOS transistors M1 and M2 are switched around). Transistor characteristics similar to those of the nMOS transistor M10 are exhibited also when three or more nMOS transistors whose total channel length is equal to the channel length of the nMOS transistor M10 are connected in series, with the same voltage applied to the gates thereof. Thus, by connecting a plurality of unit transistors in series and giving the same voltage (or the same signal) to the gates thereof, it is possible to form a transistor whose channel length is equal to the sum of the channel lengths of the plurality of unit transistors. That is, in the comparator 102 shown in FIG. 4, the differential transistor M102 whose channel length is equal to the sum of the channel lengths of the unit transistors M121, M122, . . . , M12p can be formed by the unit transistors M121, M122, . . . , M12p. This similarly applies also to the unit transistors M131, M132, . . . , M13p.

By dividing the differential transistor M102 into p unit transistors M121, M122, . . . , M12p as described above, the differential transistor M102 can be formed within the cell pitch of the comparator 102. The channel length of the differential transistor M102 can be set arbitrarily. For example, the channel length of the differential transistor M102 can be made longer than the cell pitch width (CP) of the comparator 102. Moreover, since the channel width direction of the unit transistors M121, M122, . . . , M12p does not need to be matched with the repetition direction of the comparator 102, the channel width of the differential transistor M102 can be set arbitrarily. Note that this similarly applies also to the differential transistor M103. Thus, since the channel length and the channel width of the differential transistors M102 and M103 can both be set arbitrarily, it is possible to ensure the mutual conductance (gm) of the differential transistors M102 and M103, and to improve the comparison precision of the comparator 102 and increase the speed of the comparator 102.

Since it is possible to both increase the degree of integration of the analog-digital converter 12 and improve the performance thereof, it is possible to increase the number of pixels of the image sensor 10 and to accurately supply high-definition captured data DDD.

LAYOUT EXAMPLE 1

Figure 6:
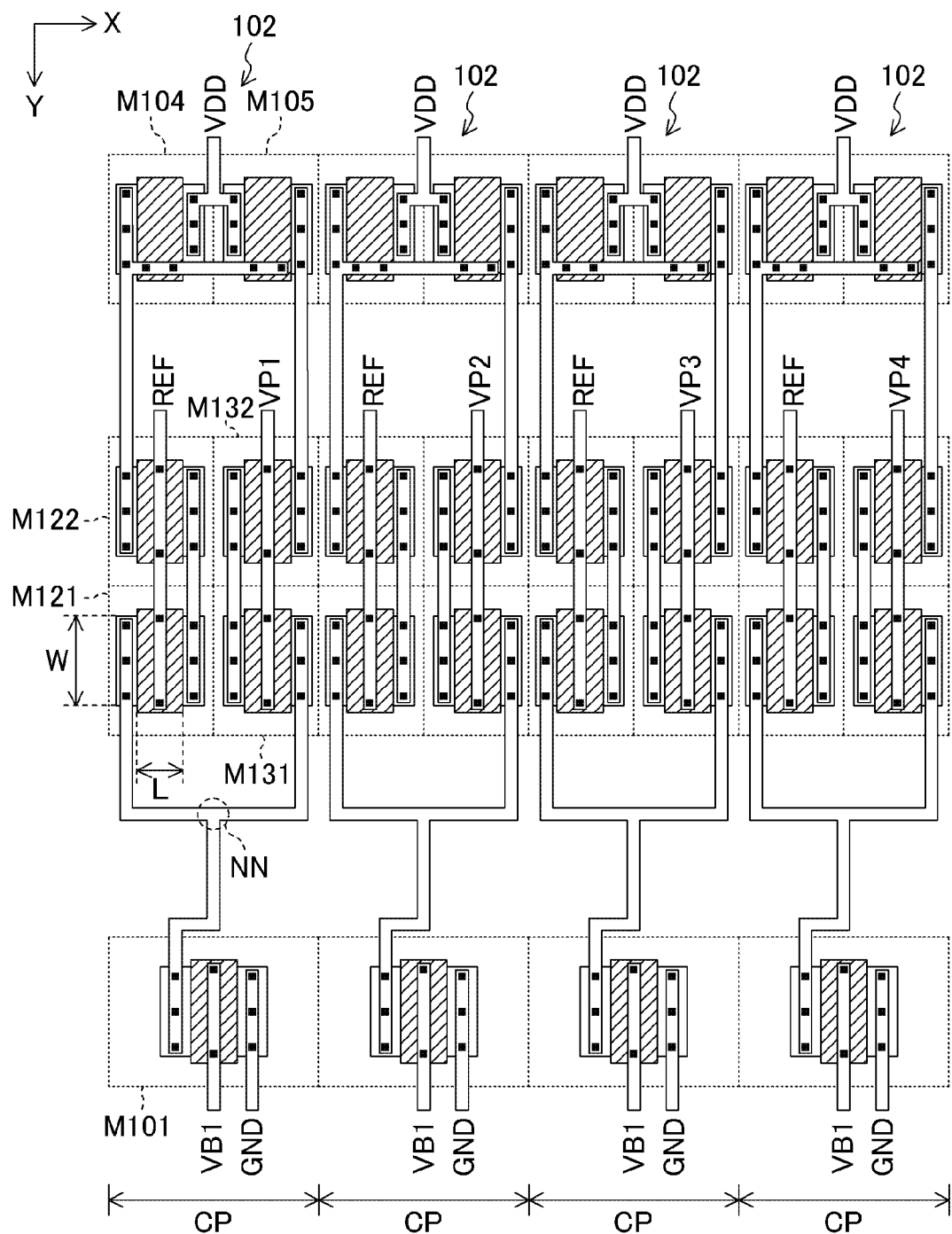
FIG. 6 is a diagram illustrating Layout Example 1 of the comparator shown in FIG. 1.

Referring now to FIG. 6, Layout Example 1 of the comparators 102, 102, . . . , 102 shown in FIG. 1 will be described. Here, a case where n=4 and p=2 is illustrated (the description similarly applies also to FIGS. 7, 8, 9, 16 and 17 to be shown below).

In each of the comparators 102, 102, . . . , 102, the unit transistors M121 and M122 and the unit transistors M131 and M132 are arranged in the Y-axis direction (the direction perpendicular to the X-axis direction) so that the channel length direction thereof matches the X-axis direction (the repetition direction). The channel length (L) of the unit transistors M121, M122, M131 and M132 is shorter than the cell pitch width (CP) of the comparator 102. Thus, the unit transistors M121, M122, M131 and M132 can be arranged within the cell pitch of the comparator 102, and it is therefore possible to increase the degree of integration of the comparator 102.

In each of the comparators 102, 102, . . . , 102, the unit transistors M131 and M132 are arranged in line symmetry with the unit transistors M121 and M122 with respect to a reference line which is a straight line extending in the Y-axis direction so as to pass through a reference point within the cell pitch of the comparator 102 (e.g., a connection node NN between the source of the unit transistors M121 and M131 and the drain of the current source transistor M101). With such a configuration, it is possible to ensure the differential property of the differential transistors M102 and M103, and to improve the comparison precision of the comparator 102.

Moreover, the unit transistors M121 included in the comparators 102, 102, . . . , 102 are arranged along the same straight line in the X-axis direction (repetition direction). This similarly applies also to the unit transistors M121, M131 and M132. That is, the k-th unit transistor M12$k$ ($1 \leq k \leq p$) and the k-th unit transistor M13$k$ included in each of the comparators 102, 102, . . . , 102 are arranged along the same straight line in the X-axis direction. Note that the channel length (L) of each of the unit transistors M121, M122, M131 and M132 is shorter than ½ the cell pitch width (CP) of the comparator 102. With such a configuration, it is possible to reduce characteristics variations between comparators due to the transistor arrangement. For example, it is possible to reduce the fixed pattern noise between the comparators 102, 102, . . . , 102. It is also possible to reduce the increase in the circuit area of the comparators 102, 102, . . . , 102.

LAYOUT EXAMPLE 2

Figure 7:
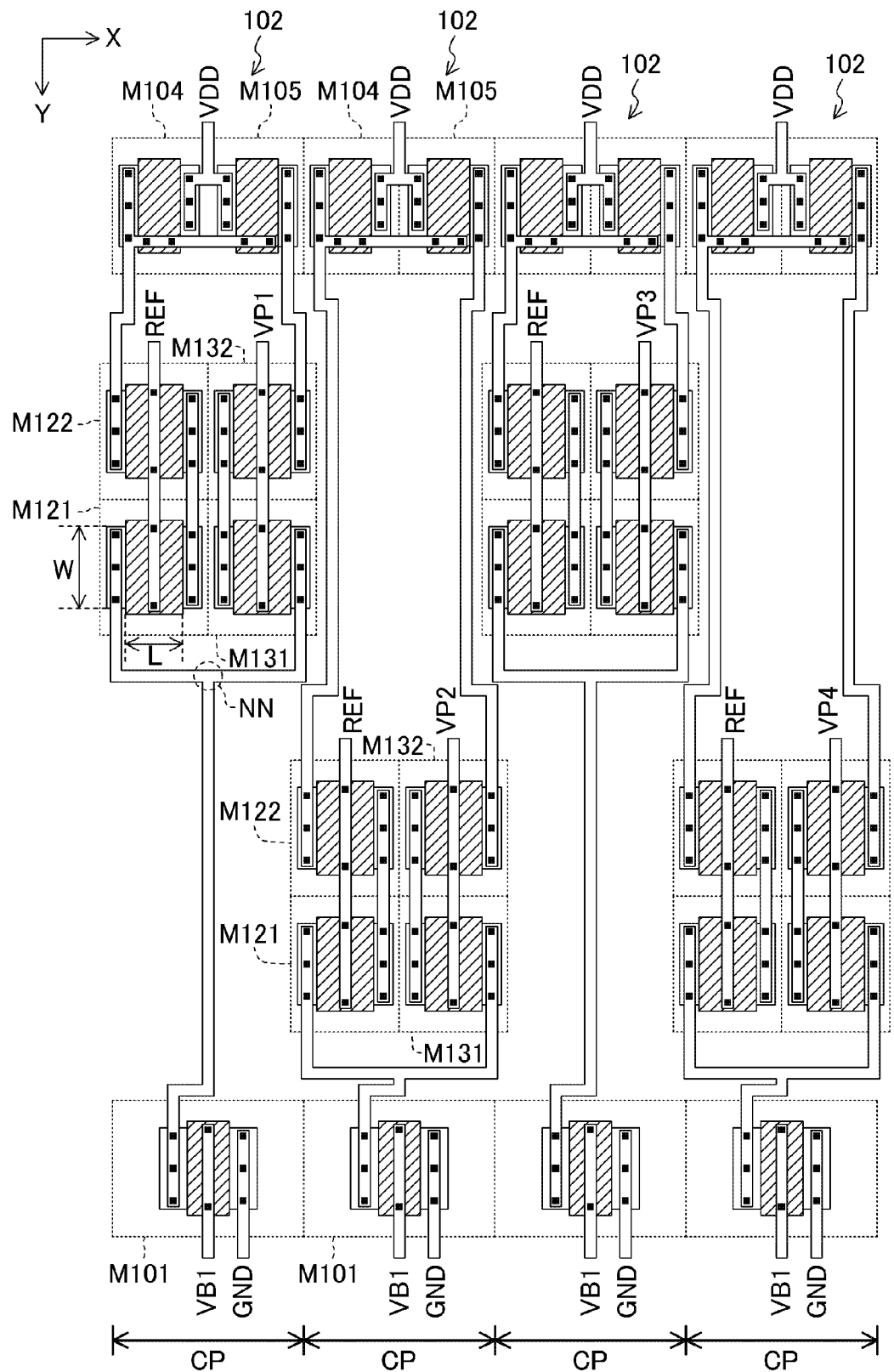
FIG. 7 is a diagram illustrating Layout Example 2 of the comparator shown in FIG. 1.

Referring now to FIG. 7, Layout Example 2 of the comparators 102, 102, . . . , 102 shown in FIG. 1 will be described.

In the layout example shown in FIG. 7, as in FIG. 6, the unit transistors M121 and M122 and the unit transistors M131 and M132 are arranged in line symmetry with each other with respect to a reference line which is a straight line extending in the Y-axis direction so as to pass through a reference point within the cell pitch of the comparator 102 (e.g., the connection node NN). Note however that in FIG. 7, the unit transistors M121, M122, M131 and M132 included in each of the comparators 102, 102, . . . , 102 are arranged so as not to be adjacent in the X-axis direction to any of the unit transistors M121, M122, M131 and M132 included in another adjacent comparator. With such a configuration, the cell pitch of the comparators 102, 102, . . . , 102 can be partially extended in the X-axis direction (repetition direction). That is, the area where the unit transistors M121, M122, . . . , M12$p$ and the unit transistors M131, M132, M13$p$ are formed can be extended in the X-axis direction. Therefore, the channel length (L) of the unit transistors M121, M122, . . . , M12$p$ and the unit transistors M131, M132, . . . , M13$p$ can be extended, and as a result, the channel length of the differential transistors M102 and M103 can be extended. Thus, it is possible to further improve the performance of the comparator 102.

LAYOUT EXAMPLE 3

Figure 8:
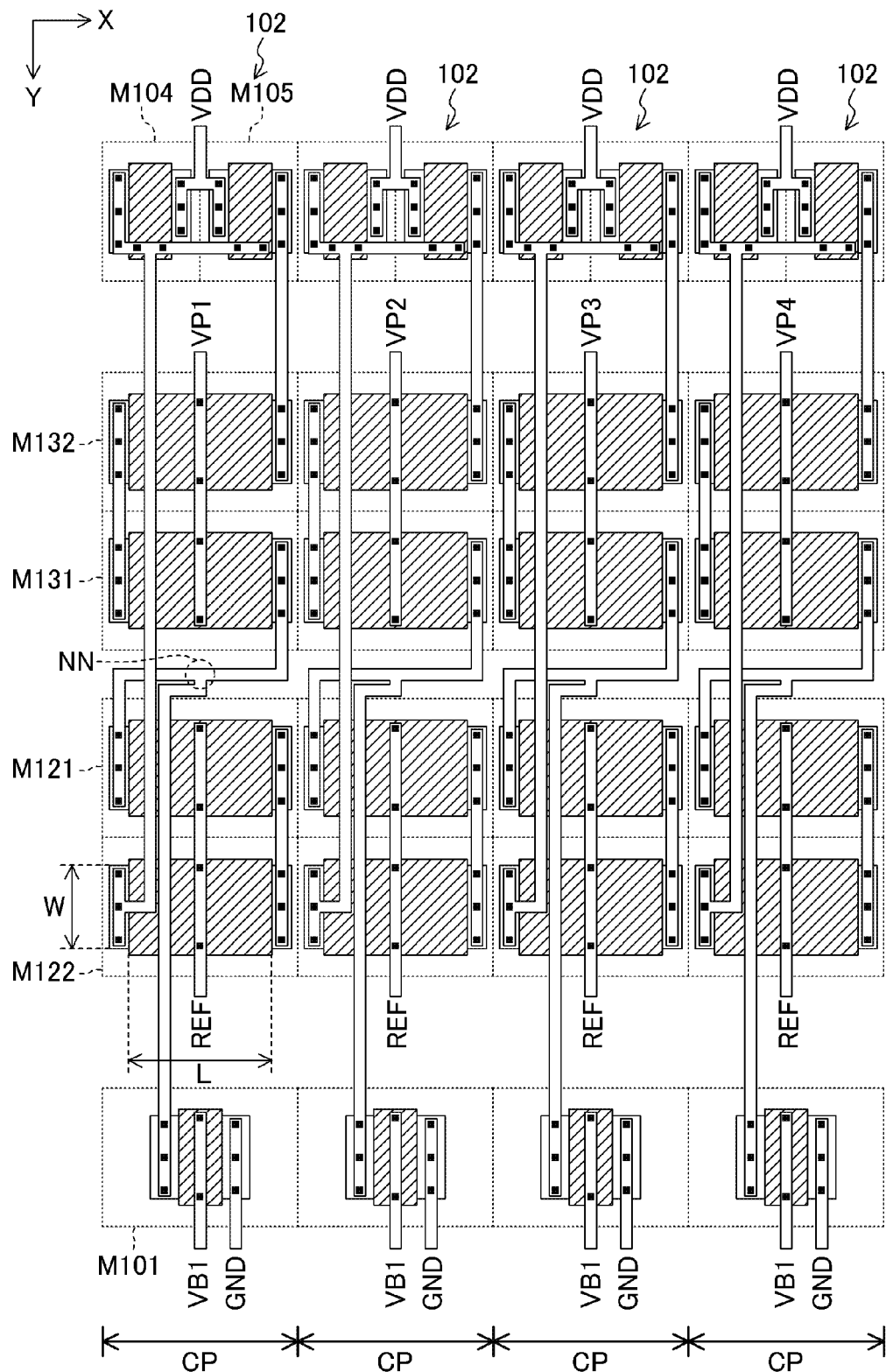
FIG. 8 is a diagram illustrating Layout Example 3 of the comparator shown in FIG. 1.

Referring now to FIG. 8, Layout Example 3 of the comparators 102, 102, . . . , 102 shown in FIG. 1 will be described.

In each of the comparators 102, 102, . . . , 102, the unit transistors M121 and M122 and the unit transistors M131 and M132 are arranged in the Y-axis direction (the direction perpendicular to the X-axis direction) so that the channel length direction thereof matches the X-axis direction.

In each of the comparators 102, 102, . . . , 102, the unit transistors M131 and M132 are arranged in point symmetry with the unit transistors M121 and M122 with respect to a reference point within the cell pitch of the comparator 102 (e.g., the connection node NN between the source of the unit transistors M121 and M131 and the drain of the current source transistor M101). With such a configuration, it is possible to ensure the differential property of the differential transistors M102 and M103, and to improve the comparison precision of the comparator 102.

Moreover, the k-th unit transistors M12$k$ ($1 \leq k \leq p$) included in the comparators 102, 102, . . . , 102 are arranged along the same straight line in the X-axis direction. Similarly, the k-th unit transistors M13$k$ included in the comparators 102, 102, . . . , 102 are arranged along the same straight line in the X-axis direction. Note that in such a case, the channel length (L) of the unit transistors M121, M122, M131 and M132 is shorter than the cell pitch width (CP) of the comparator 102. With such a configuration, the channel length of the unit transistors M121, M122, . . . , M12$p$ and the unit transistors M131, M132, . . . , M13$p$ can be extended as compared with the layout example of FIG. 6, and it is therefore possible to extend the channel length of the differential transistors M102 and M103. Thus, it is possible to further improve the performance of the comparator 102.

LAYOUT EXAMPLE 4

Figure 9:
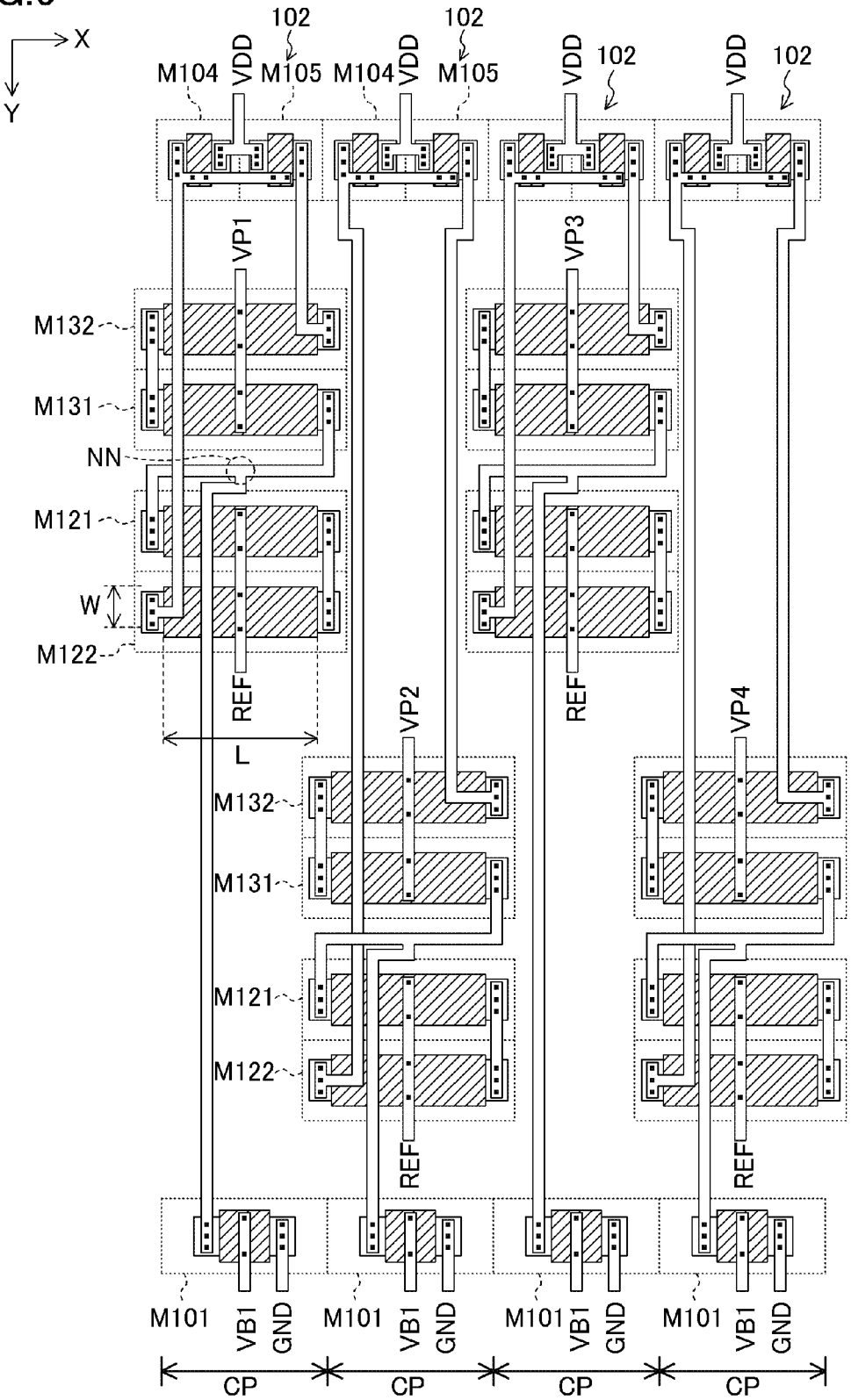
FIG. 9 is a diagram illustrating Layout Example 4 of the comparator shown in FIG. 1.

Referring now to FIG. 9, Layout Example 4 of the comparators 102, 102, . . . , 102 shown in FIG. 1 will be described.

In the layout example shown in FIG. 9, as in FIG. 8, the unit transistors M121 and M122 and the unit transistors M131 and M132 are arranged in point symmetry with each other with respect to a reference point within the cell pitch of the comparator 102 (e.g., the connection node NN). Note however that in FIG. 9, the unit transistors M121, M122, M131 and M132 included in each of the comparators 102, 102, . . . , 102 are arranged so as not to be adjacent in the X-axis direction to any of the unit transistors M121, M122, M131 and M132 included in another adjacent comparator. With such a configuration, the cell pitch of the comparators 102, 102, . . . , 102 can be partially extended in the X-axis direction (repetition direction), and therefore the channel length (L) of the unit transistors M121, M122, . . . , M12$p$ and the unit transistors M131, M132, . . . , M13$p$ can be extended. Thus, it is possible to extend the channel length of the differential transistors M102 and M103, and to further improve the performance of the comparator 102.

(Variation of Embodiment 1)

[Channel Length of Unit Transistor]

Note that in each of the comparators 102, 102, . . . , 102, the unit transistors M121, M122, . . . , M12$p$ may have the same channel length. With such a configuration, it is possible to avoid having a wasted area (an area where no device can be formed) on a semiconductor substrate (a semiconductor substrate for forming an analog-digital converter thereon). Alternatively, the unit transistors M121, M122, . . . , M12$p$ may have different channel lengths. With such a configuration, the number of unit transistors forming the differential transistor M102 can be reduced as compared with a case where the unit transistors M121, M122, . . . , M12$p$ have the same channel length. Note that this similarly applies also to the unit transistors M131, M132, . . . , M13$p$.

[Load Transistor]

In each of the comparators 102, 102, . . . , 102, the load transistors M104 and M105 may also be formed by a plurality of unit transistors, as are the differential transistors M102 and M103. For example, the load transistor M104 may be formed by a plurality of unit transistors connected in series between the power supply node and the drain of the differential transistor M102. The plurality of unit transistors forming the load transistors M104 and M105 may be arranged in line symmetry as shown in FIGS. 6 and 7, or arranged in point symmetry as shown in FIGS. 8 and 9.

[Amplifier]

Figure 10:
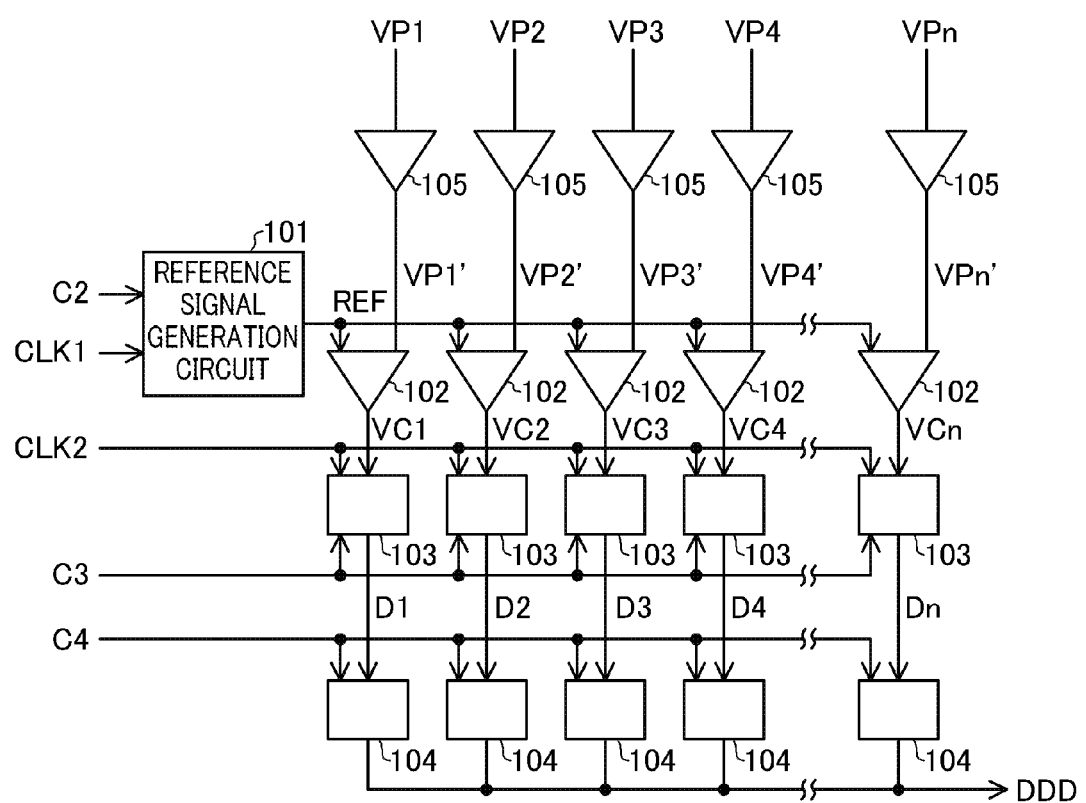
FIG. 10 is a diagram illustrating a variation of an analog-digital converter.

The analog-digital converter 12 may further include n amplifiers 105, 105, . . . , 105 as shown in FIG. 10. The amplifiers 105, 105, . . . , 105 are arranged in a predetermined repetition direction (e.g., in the row direction of the image sensor 10) with a predetermined cell pitch. The amplifiers 105, 105, . . . , 105 correspond respectively to the n pixel voltages VP1, VP2, . . . , Vn, and amplify the pixel voltages corresponding to the amplifiers to output the amplified pixel voltages VP1', VP2', . . . , VPn' to the comparators corresponding to the amplifiers.

Figure 11:
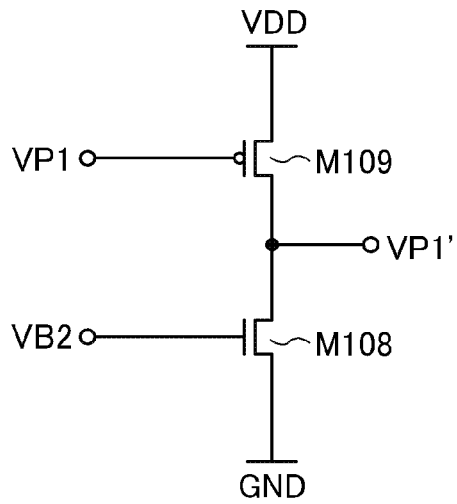
FIG. 11 is a diagram showing a configuration example of an amplifier shown in FIG. 10.

For example, each of the amplifiers 105, 105, . . . , 105 includes a current source transistor M108 and a driving transistor M109, as shown in FIG. 11. A bias voltage VB2 for supplying a predetermined current is given to the gate of the current source transistor M108, and the source of the current source transistor M108 is connected to the ground node. A pixel voltage (here, the pixel voltage VP1) corresponding to the amplifier 105 is given to the gate of the driving transistor M109, and the source of the driving transistor M109 is connected to the power supply node, and the drain of the driving transistor M109 to the drain of the current source transistor M108.

Figure 12:
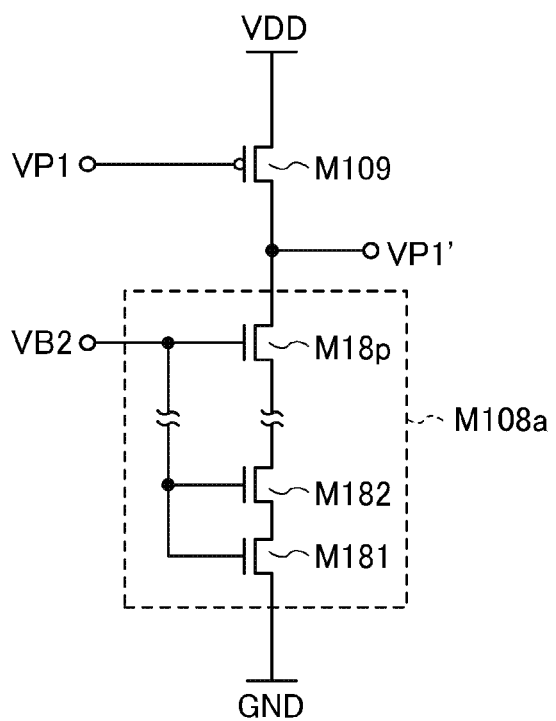
FIG. 12 is a diagram showing a variation of the amplifier shown in FIG. 10.

Note that each of the amplifiers 105, 105, . . . , 105 may include a current source transistor M108a formed by p unit transistors M181, M182, . . . , M18p as shown in FIG. 12, instead of the current source transistor M108 shown in FIG. 11. The unit transistors M181, M182, . . . , M18p are connected in series between the ground node and the drain of the driving transistor M109, and the bias voltage VB2 is given to the gate thereof. Thus, the current source transistor M108a can be formed within the cell pitch of the amplifier 105 by dividing the current source transistor M108a into the unit transistors M181, M182, . . . M18p. The channel length and the channel width of the current source transistor M108a included in each of the amplifiers 105, 105, . . . , 105 can be set arbitrarily, and it is possible to increase the resistance against variations of the power supply voltage between the amplifiers 105, 105, . . . , 105. Thus, it is possible to improve the performance of the analog-digital converter 12.

Note that the analog-digital converter 12 may further include n amplifiers between the n comparators 102, 102, . . . , 102 and the n counters 103, 103, . . . , 103. Each of these n amplifiers amplifies one of the output voltages VP1, VP2, . . . , VPn that corresponds to the amplifier, and outputs the amplified voltage to a counter that corresponds to the amplifier. These n amplifiers may have a configuration as shown in FIG. 11, or may have a configuration as shown in FIG. 12 (a configuration including a current source transistor formed by p unit transistors). The amplifier configuration is not limited to those illustrated here, but may be any configuration as long as it is capable of amplifying the voltage.

[Readout Circuit, Bias Circuit]

Figure 13:
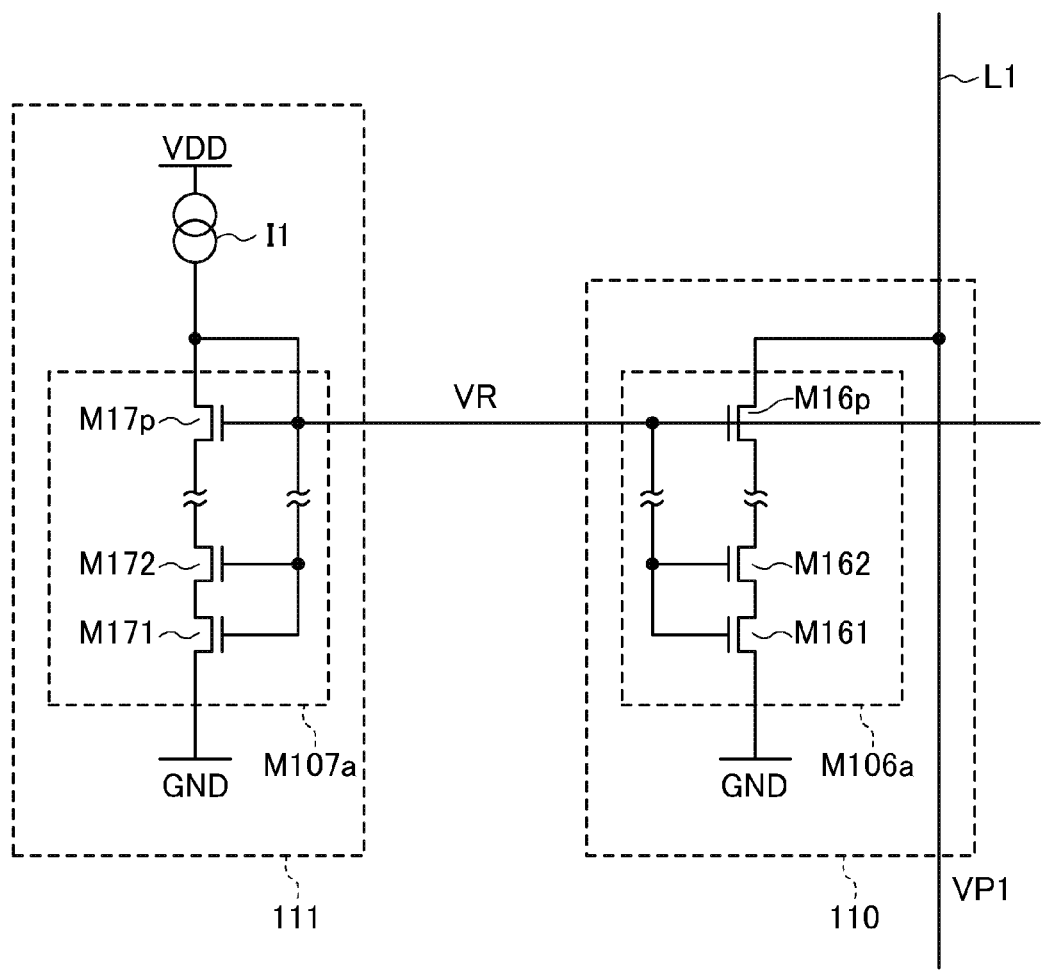
FIG. 13 is a diagram showing a variation of the readout circuit and the bias circuit shown in FIG. 1.

Each of the readout circuits 110, 110, . . . , 110 may include a current source transistor M106a formed by p unit transistors M161, M162, . . . , M16p as shown in FIG. 13, instead of the current source transistor M106 shown in FIG. 2. The unit transistors M161, M162, . . . , M16p are connected in series between the ground node and a column signal line (here, the column signal line L1) corresponding to the readout circuit 110, and the reference voltage VR is given to the gate thereof. Thus, the current source transistor M106a can be formed within the cell pitch of the readout circuit 110 by dividing the current source transistor M106a into unit transistors M161, M162, . . . , M16p. The channel length and the channel width of the current source transistor M106a included in each of the readout circuits 110, 110, . . . , 110 can be set arbitrarily, and it is possible to increase the resistance against variations of the power supply voltage between the readout circuits 110, 110, . . . , 110. Thus, it is possible to improve the performance of the image sensor system 1.

The bias circuit 111 may include a current mirror transistor M107a formed by p unit transistors M171, M172, . . . , M17p as shown in FIG. 13, instead of the current mirror transistor M107 shown in FIG. 2. Particularly, where the current source transistor included in each of the readout circuits 110, 110, . . . , 110 is formed by p unit transistors, the current mirror transistor included in the bias circuit 111 is preferably formed by p unit transistors. With such a configuration, it is possible to improve the current precision.

Note that only one of the current source transistor of the readout circuits 110, 110, . . . , 110 and the current mirror transistor of the bias circuit 111 may be formed by p unit transistors. With such a configuration, the current ratio between the current source transistor of the readout circuits 110, 110, . . . , 110 and the current mirror transistor of the bias circuit 111 can be adjusted.

[Correlated Double Sampling]

Note that the image sensor system 1 shown in FIG. 1 may have a correlated double sampling (CDS) function. For example, the timing control circuit 14 controls various sections of the image sensor system 1 so that the various sections of the image sensor system 1 operate as follows.

First, the vertical scanning circuit 11 outputs one of the row selection signals S1, S2, . . . , Sn to select the n pixel portions 100, 100, . . . , 100. Then, the vertical scanning circuit 11 outputs the reset signal RST to the n×m pixel portions 100, 100, . . . , 100 to initialize the charge of the n×m pixel portions 100, 100, . . . , 100, after which the reference signal generation circuit 101 starts outputting the reference signal REF, the counters 103, 103, . . . , 103 start the count operation, and the digital memories 104, 104, . . . , 104 store the digital values D1, D2, . . . , Dn from the counters 103, 103, . . . , 103. Thus, the digital values D1, D2, . . . , Dn are obtained which are equivalent to the amounts of offset of the pixel voltages VP1, VP2, . . . , VPn. Then, the vertical scanning circuit 11 outputs the transfer signal TR to the n×m pixel portions 100, 100, . . . , 100 so as to make the n×m pixel portions 100, 100, . . . , 100 perform charge transfer (charge transfer from the photodiode PD to the floating diffusion portion FD), after which the reference signal generation circuit 101 starts outputting the reference signal REF, and the counters 103, 103, . . . , 103 start the count operation. Thus, the digital values D1, D2, . . . , Dn are obtained which are equivalent to the pixel voltages VP1, VP2, . . . , VPn of the n selected pixel portions 100, 100, . . . , 100. Note that offsets are included in these pixel voltages VP1, VP2, . . . , VPn. Here, the digital memories 104, 104, . . . , 104 subtract offset digital values (digital values which are equivalent to amounts of offset) from the digital values D1, D2, . . . , Dn obtained by the counters 103, 103, . . . , 103, and store the digital values obtained by the subtraction.

With such a control, offsets added to the digital values D1, D2, ..., Dn can be removed. Particularly, where the comparators 102, 102, ..., 102 have such a point symmetry layout as shown in FIG. 8 or 9, there are possibilities of deterioration of the differential property and addition of the offset voltage because while the transistor arrangement is in point symmetry, the signal lines are not in point symmetry in each of the comparators 102, 102, ..., 102. Therefore, it is effective to perform correlated double sampling.

(Embodiment 2)

Figure 14:
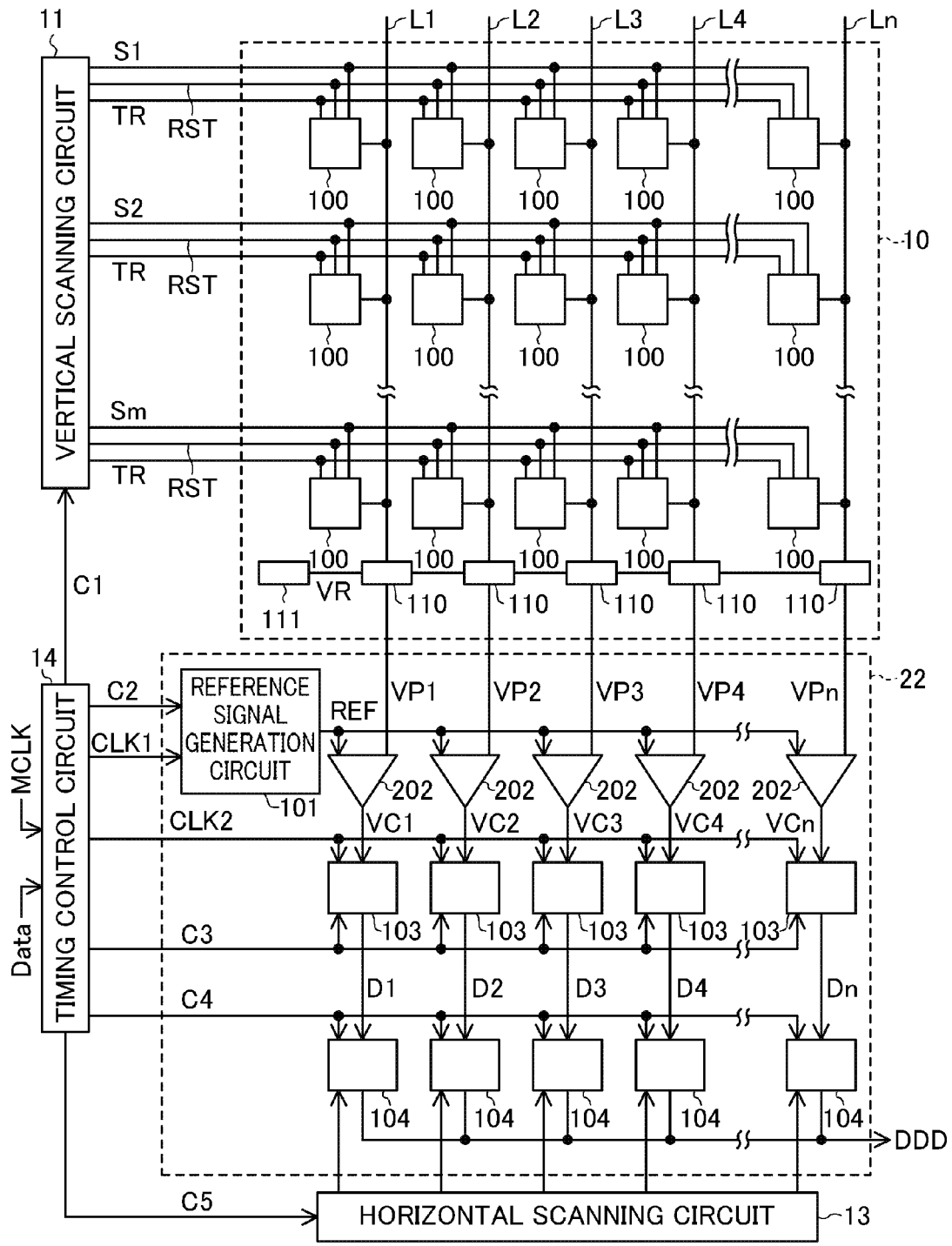
FIG. 14 is a diagram showing a configuration example of an image sensor system of Embodiment 2.

FIG. 14 shows a configuration example of an image sensor system 2 of Embodiment 2. The image sensor system 2 includes an analog-digital converter 22, instead of the analog-digital converter 12 shown in FIG. 1. The analog-digital converter 22 includes n comparators 202, 202, ..., 202, instead of the n comparators 102, 102, ..., 102 shown in FIG. 1. Otherwise, the configuration is similar to that of FIG. 1.

Figure 15:
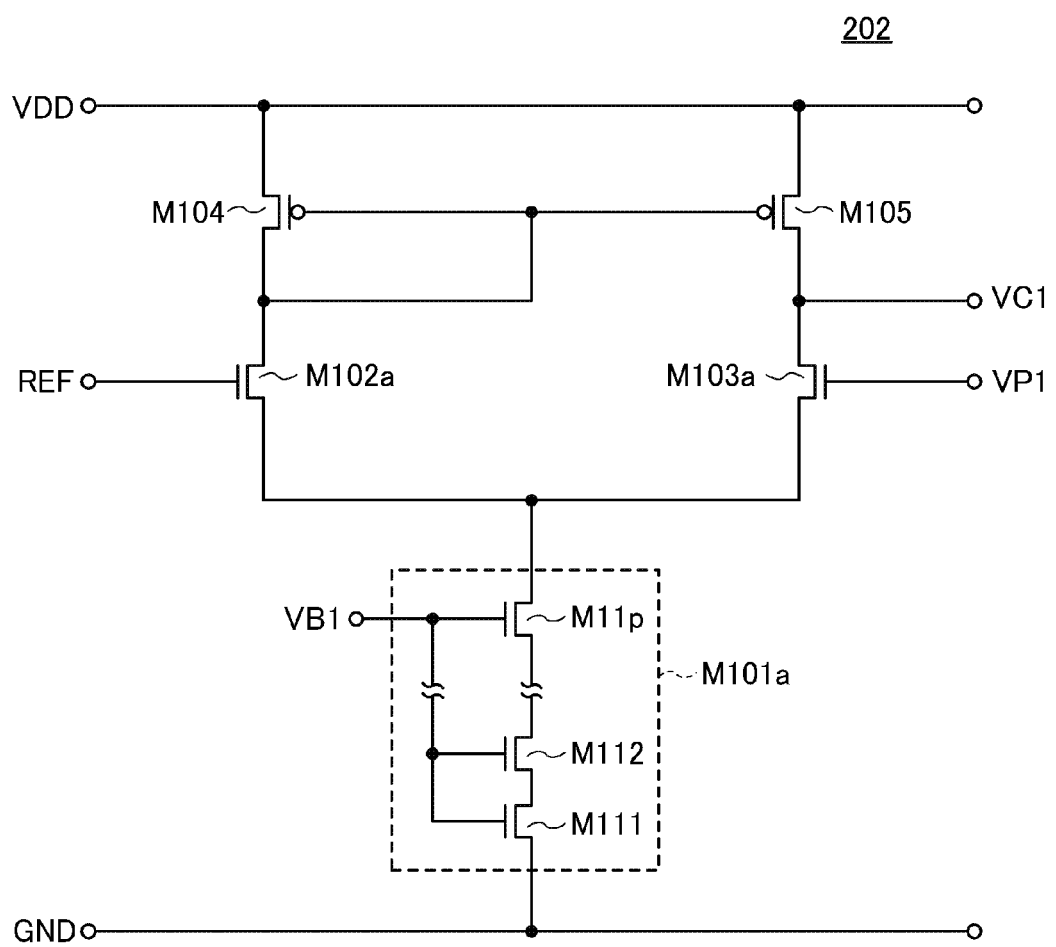
FIG. 15 is a diagram showing a configuration example of a comparator shown in FIG. 14.

FIG. 15 shows a configuration example of the comparator 202 shown in FIG. 14. The comparator 202 includes a current source transistor M101a and the differential transistors M102a and M103a, instead of the current source transistor M101 and the differential transistors M102 and M103 shown in FIG. 4. The current source transistor M101a is formed by p unit transistors M111, M112, ..., M11p. The unit transistors M111, M112, ..., M11p are connected in series between the ground node and the drain of the differential transistor M102 (M103), and the bias voltage VB1 is given to the gate thereof. The source of the differential transistors M102a and M103a is connected to the drain of the current source transistor M101a (here, the drain of the unit transistor M11p).

Thus, the current source transistor M101a can be formed within the cell pitch of the comparator 202 by dividing the current source transistor M101 into p unit transistors M111, M112, ..., M11p. The channel length of the current source transistor M101a can be set arbitrarily. For example, the channel length of the current source transistor M101a can be set longer than the cell pitch width (CP) of the comparator 202. Moreover, since the channel width direction of the unit transistors M111, M112, ..., M11p does not need to be matched with the repetition direction of the comparator 202, the channel width of the current source transistor MiOla can be set arbitrarily. Thus, since the channel length and the channel width of the current source transistor M101a can be both set arbitrarily, it is possible to increase the resistance against variations of the power supply voltage between the comparators 202, 202, ..., 202. Thus, it is possible to improve the performance of the analog-digital converter 22.

LAYOUT EXAMPLE 1

Figure 16:
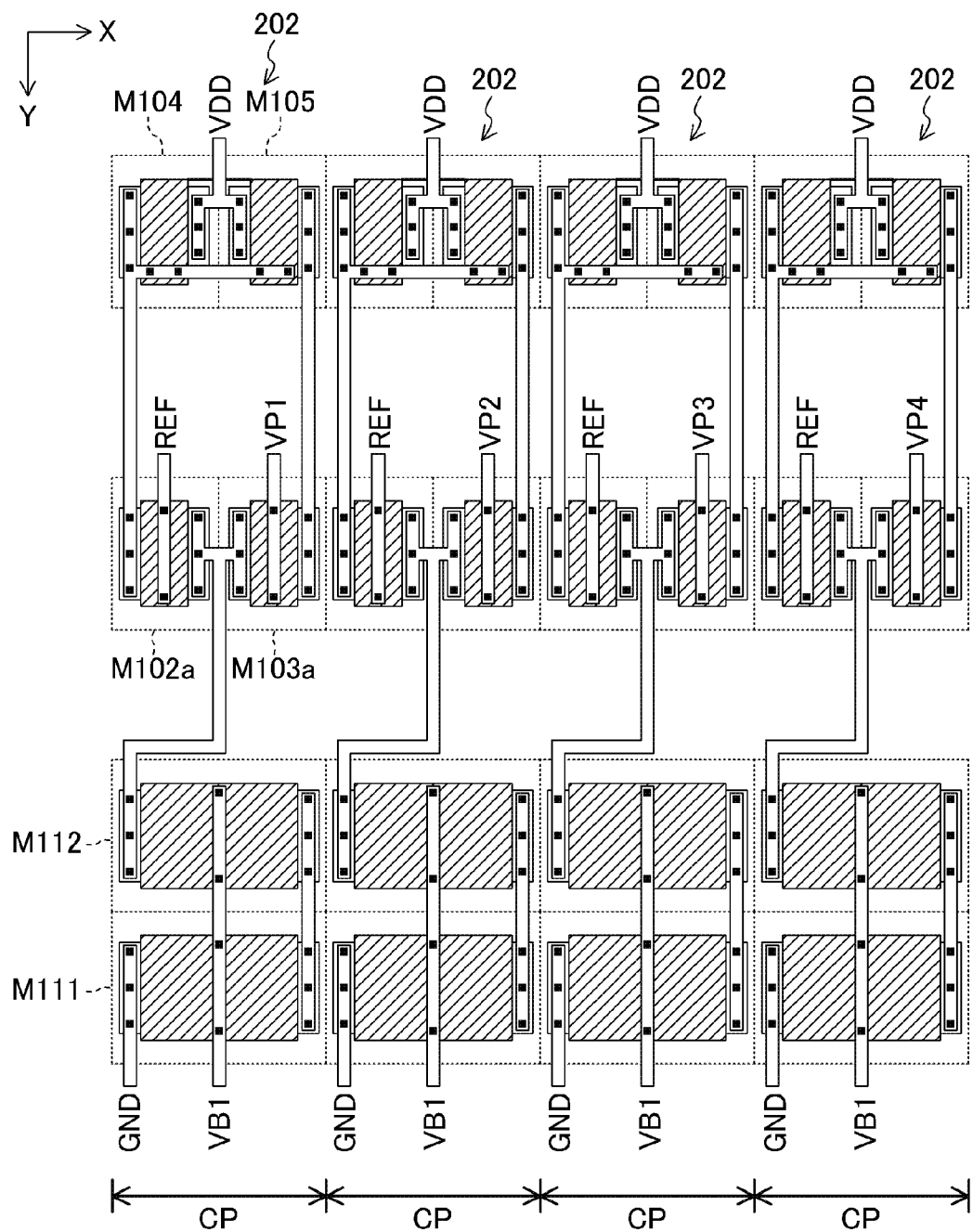
FIG. 16 is a diagram illustrating Layout Example 1 of the comparator shown in FIG. 14.

Referring now to FIG. 16, Layout Example 1 of the comparators 202, 202, ..., 202 shown in FIG. 14 will be described.

In each of the comparators 202, 202, ..., 202, the unit transistors M111 and M112 are arranged in the Y-axis direction so that the channel length direction thereof matches the X-axis direction. The channel length (L) of the unit transistors M111 and M112 is shorter than the cell pitch width (CP) of the comparator 202.

Moreover, the unit transistors M111 included in the comparators 202, 202, ..., 202 are arranged along the same straight line in the X-axis direction. This similarly applies also to the unit transistor M112. That is, the k-th unit transistors M11k (1≦k≦p) included in the comparators 202, 202, ..., 202 are arranged along the same straight line in the X-axis direction. Note that the channel length (L) of the unit transistors M111 and M112 is shorter than the cell pitch width (CP) of the comparator 202. With such a configuration, the unit transistors M111 and M112 can be arranged within the cell pitch of the comparator 202, and it is possible to increase the resistance against variations of the power supply voltage between the comparators 202, 202, ..., 202. Particularly, such a configuration is effective in cases where the number of pixels is large in the column direction such as single-lens reflex camera systems.

LAYOUT EXAMPLE 2

Figure 17:
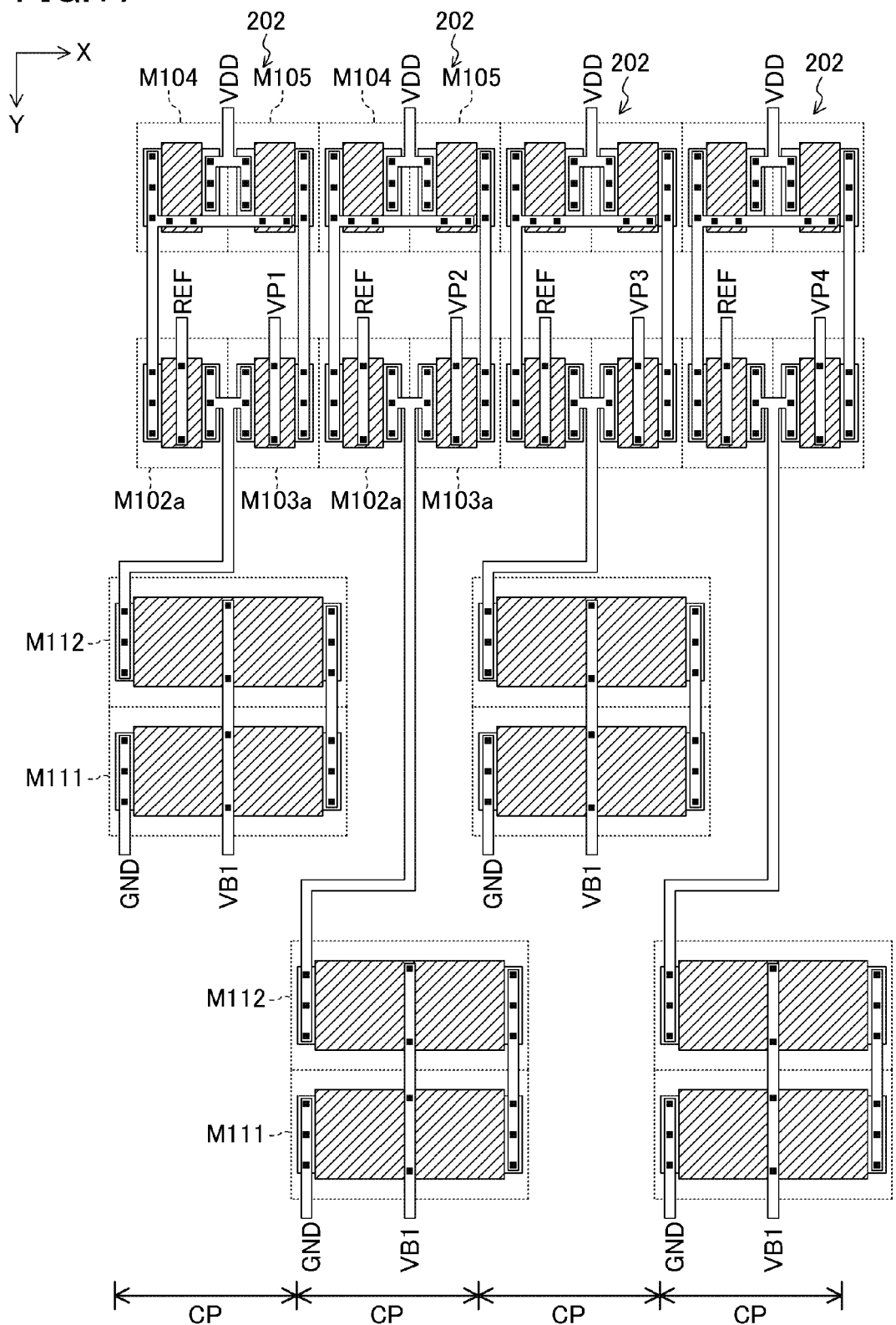
FIG. 17 is a diagram illustrating Layout Example 2 of the comparator shown in FIG. 14.

Referring now to FIG. 17, Layout Example 2 of the comparators 202, 202, ..., 202 shown in FIG. 14 will be described.

In the layout example shown in FIG. 17, as in FIG. 16, the unit transistors M111 and M112 are arranged in the Y-axis direction so that the channel length direction thereof matches the X-axis direction. Note however that in FIG. 17, the unit transistors M111 and M112 included in each of the comparators 202, 202, ..., 202 are arranged so as not to be adjacent in the X-axis direction to any of the unit transistors M111 and M112 included in another adjacent comparator. With such a configuration, the cell pitch of the comparators 202, 202, ..., 202 can be partially extended in the X-axis direction (repetition direction), and therefore the channel length (L) of the unit transistors M111, M112, ..., M11p can be extended. Thus, it is possible to extend the channel length of a current source transistor M111a, and it is possible to realize an improvement to the performance of the comparator 202 (e.g., an increase in the resistance against variations of the power supply voltage).

(Variation of Embodiment 2)

Note that each of the comparators 202, 202, ..., 202 may include the differential transistors M102 and M103 shown in FIG. 4 instead of the differential transistors M102a and M103a. Moreover, each of the readout circuits 110, 110, ..., 110 may include the current source transistor M106a (the unit transistors M161, M162, ..., M16p) shown in FIG. 13, and the bias circuit 111 may include the current mirror transistor M107a (the unit transistors M171, M172, ..., M17p) shown in FIG. 13. That is, not only the current source transistor of the comparators 202, 202, ..., 202, but also the differential transistor and the load transistor of the comparators 202, 202, ..., 202, the current source transistor of the readout circuits 110, 110, ..., 110, and the current mirror transistor of the bias circuit 111 may be formed by a plurality of unit transistors. Note that the unit transistors M161, M162, ..., M16p forming the current source transistor M106a, and the unit transistors M171, M172, ..., M17p forming the current mirror transistor M107a may be arranged as shown in FIG. 16 or arranged as shown in FIG. 17. The analog-digital converter 22 may further include the n amplifiers 105, 105, ..., 105 shown in FIG. 10, or may include n amplifiers between the n comparators 202, 202, ..., 202 and the n counters 103, 103, ..., 103. These amplifiers may have such a configuration as shown in FIG. 11 or such a configuration as shown in FIG. 12. Note that a plurality of unit transistors forming each amplifier may be arranged as shown in FIG. 16 or arranged as shown in FIG. 17.

Moreover, in each of the comparators 202, 202, ..., 202, the unit transistors M111, M112, ..., M11p may have the same channel length or may have different channel lengths. Similarly for the load transistor of the comparator 202, the current source transistor of the readout circuit 110, the current mirror transistor of the bias circuit 111 and the current source transistor of the amplifier, unit transistors of each of these transistors may have the same channel length or different channel lengths.

(Camera Device)

Figure 18:
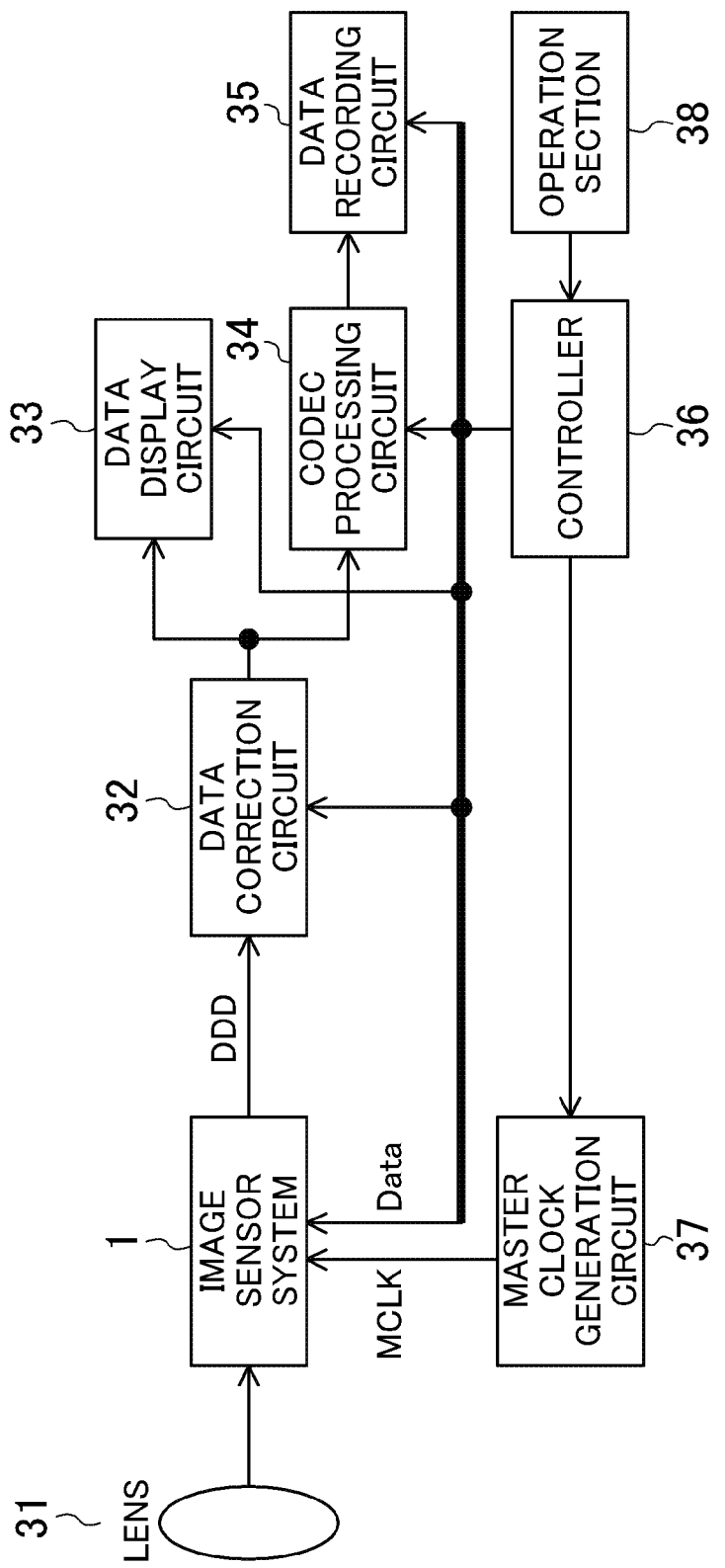
FIG. 18 is a diagram illustrating a camera device including an image sensor system shown in FIG. 1 or 14.

As shown in FIG. 18, the image sensor systems 1 and 2 are applicable to camera devices (e.g., digital video cameras, digital still cameras, on-vehicle cameras, monitoring cameras, etc.). A camera device shown in FIG. 18 includes, besides the image sensor system 1, a lens 31, data processing circuits (a data correction circuit 32, a data display circuit 33, a codec processing circuit 34, a data recording circuit 35, etc.), a controller 36, a master clock generation circuit 37, and an operation section 38. Note that the camera device may be a device for capturing a still image, a device for capturing a video image, or a device for capturing both.

The image sensor system 1 converts the image of the object received via the lens 31 to the captured data DDD, and supplies the captured data DDD to the data correction circuit 32 in response to the control signal from the controller 36. The data correction circuit 32 performs a data correction process (a gamma correction process, a white balance process, a color separation process, etc.) on the captured data DDD from the image sensor system 1, and supplies the processed captured data to the data display circuit 33 and the codec processing circuit 34. Note that the data correction circuit 32 may supply captured data subjected to the same correction process to the data display circuit 33 and to the codec processing circuit 34, or may supply captured data subjected to a correction process for the data display circuit 33 to the data display circuit 33 while supplying captured data subjected to a correction process for the codec processing circuit 34 to the codec processing circuit 34. The data display circuit 33 displays an image on the display based on the captured data from the data correction circuit 32. The codec processing circuit 34 compresses the captured data from the data correction circuit 32 by a predetermined compression scheme, and supplies the compressed data to the data recording circuit 35. The data recording circuit 35 records the captured data, which has been compressed by the codec processing circuit 34, on a recording medium (e.g., a semiconductor memory, a magnetic disc, an optical disc, a memory card, etc.) in response to the control by the controller 36. The recording medium may be built in the camera device or may be an external medium that can be attached/detached to/from the camera device. The controller 36 controls the image sensor system 1, the data correction circuit 32, the data display circuit 33, the codec processing circuit 34, the data recording circuit 35, and the master clock generation circuit 37 in response to a user operation given to the operation section 38. The controller 36 supplies the control data Data to the image sensor system 1 (e.g., the timing control circuit 14). The master clock generation circuit 37 generates a master clock MCLK for operating the image sensor system 1, and supplies the master clock MCLK to the image sensor system 1 (e.g., the timing control circuit 14). The operation section 38 is formed by an operation button (e.g., a shutter button for capturing a still image, a start button or a stop button for capturing a video image, etc.), an operation lever, a jog dial, a touch panel, etc., and supplies an operation signal according to the user operation to the controller 36.

By providing the image sensor system 1 (or the image sensor system 2) in a camera device, as described above, it is possible to realize a reduction in the size of a camera device and an increase in the number of pixels thereof, and to accurately provide high-definition captured data.

(Other Embodiments)

Although the above description has been directed to an example where the current source transistors M101 and M101a, the differential transistors M102, M102a, M103 and M103a are formed by "nMOS transistors" and the load transistors M104 and M105 are formed by "pMOS transistors," it is possible to improve both the degree of integration of an analog-digital converter and the performance thereof also in a case where the current source transistors M101 and M101a and the differential transistors M102, M102a, M103 and M103a are formed by "pMOS transistors" and the load transistors M104 and M105 are formed by "nMOS transistors" (a case where the signal polarity is inverted). Note that the signal polarity may be inverted also for other elements (e.g., the amplifiers 105).

At least one of the current source transistor, the differential transistor and the load transistor of the comparator, the current source transistor of the readout circuit, the current mirror transistor of the bias circuit, and the current source transistor of the amplifier (an amplifier provided upstream of the comparator, an amplifier provided downstream of the comparator) may be formed by a plurality of unit transistors. For example, only the load transistor included in each of the n comparators may be formed by a plurality of unit transistors. Only the current source transistor included in each of the n readout circuits may be formed by a plurality of unit transistors. Thus, the current source transistor of the readout circuit can be formed within the cell pitch of the readout circuit by dividing the current source transistor included in each of the n readout circuits into a plurality of unit transistors. The channel length and the channel width of the current source transistor included in each of the n readout circuits can be set arbitrarily, and it is possible to increase the resistance against variations of the power supply voltage between the n readout circuits. Only the current mirror transistor of the bias circuit may be formed by a plurality of unit transistors, and only the current source transistor included in each of the n amplifiers (n amplifiers provided upstream of n comparators or n amplifiers provided downstream of n comparators) may be formed by a plurality of unit transistors. Thus, the current source transistor of the amplifier can be formed within the cell pitch of the amplifier by dividing the current source transistor included in each of the n amplifiers into a plurality of unit transistors. The channel length and the channel width of the current source transistor included in each of the n amplifiers can be set arbitrarily, and it is possible to increase the resistance against variations of the power supply voltage between the n amplifiers.

A plurality of unit transistors for forming the comparator 102 (202) of the analog-digital converter 12 (22) may be provided in advance on a semiconductor substrate (a semiconductor substrate for forming an analog-digital converter). That is, the analog-digital converter may include a plurality of unit transistors for forming n comparators. In such a case, by connecting two or more unit transistors in series and giving the same voltage (or the same signal) to the gate of each of the unit transistors connected in series, it is possible to form a transistor having a channel length that is equal to the sum of channel lengths of the unit transistors connected in series. By connecting two or more unit transistors in parallel and giving the same voltage (or the same signal) to the gate of each of the unit transistors connected in parallel, it is possible to form a transistor having a channel width that is equal to the sum of channel widths of the unit transistors connected in parallel. By providing a plurality of unit transistors in advance on a semiconductor substrate, it is possible to freely set the channel length and the channel width of the transistor formed by the two or more unit transistors, thus improving the degree of freedom in design. For example, the transistor performance can be changed only by changing the metal layer or the via layer.

Note that a plurality of unit transistors for forming n comparators (unit transistors provided in advance on the semiconductor substrate) are preferably arranged in a direction (the Y-axis direction) perpendicular to the repetition direction (the X-axis direction) so that the channel length direction thereof matches the repetition direction. A plurality of unit transistors provided in advance on the semiconductor substrate may have the same channel length (or the same channel width) or different channel lengths (or different channel widths). For example, where a plurality of unit transistors having the same channel length are provided, it is possible to avoid having a wasted area (an area where no device can be formed) on the semiconductor substrate. On the other hand, where a plurality of unit transistors having different channel lengths are provided, it is possible to expand the range of design selections.

Note that the technique described above (the technique where a plurality of unit transistors are formed in advance on a semiconductor substrate, and two or more of the plurality of unit transistors are connected in series and/or in parallel so as to form a transistor having an intended channel length and an intended channel width) may be applicable not only to an analog-digital converter and an image sensor system, but also to other semiconductor integrated circuits.

As described above, with the analog-digital converter and the image sensor system described above, it is possible to both increase the degree of integration and improve the performance, and therefore the analog-digital converter and the image sensor system are useful for a camera device including an image sensor system or a panel driver for driving a display panel (e.g., a liquid crystal driver or a PDP driver), etc.

Note that the embodiments described above are essentially preferred embodiments, and are not intended to limit the scope of the present invention, the applications thereof, or the uses thereof.

The invention claimed is:

1. An analog-digital converter comprising:
a reference signal generation circuit for generating a reference signal whose voltage value increases or decreases over time;
n (n is an integer of 2 or more) comparators arranged in a first direction with a predetermined cell pitch and corresponding respectively to n input voltages, each comparator comparing the voltage value of the reference signal with the input voltage corresponding to the comparator;
n counters corresponding respectively to the n comparators, each counter performing a count operation in synchronism with a predetermined clock so as to output a count value at a point when an output of the comparator corresponding to the counter is inverted; and
n digital memories corresponding respectively to the n counters, each digital memory storing the count value output from the counter corresponding to the digital memory, wherein each of the n comparators includes first and second differential transistors to which the reference signal and the input voltage corresponding to the comparator are given, respectively,
the first differential transistor is formed by p (p is an integer of 2 or more) first unit transistors connected in series, the references signal being given to gates of the p first unit transistors connected in series,
the second differential transistor is formed by p second unit transistors connected in series, the input voltage being given to gates of the p second unit transistors connected in series, and
the first p unit transistors are all NMOS transistors or all PMOS transistors, and the second p unit transistors are all NMOS transistors or all PMOS transistors.

2. The analog-digital converter of claim 1, wherein
in each of the n comparators, the p first unit transistors and the p second unit transistors are arranged in a second direction perpendicular to the first direction so that a channel length direction thereof matches the first direction, and
a channel length of each of the p first unit transistors and the p second unit transistors is shorter than a cell pitch width that is equivalent to a length of the cell pitch in the first direction.

3. The analog-digital converter of claim 2, wherein
in each of the n comparators, the p second unit transistors are arranged in line symmetry with the p first unit transistors with respect to a reference line which is a straight line extending in the second direction so as to pass through a reference point within the cell pitch of the comparator.

4. The analog-digital converter of claim 3, wherein
a k-th ($1 \leq k \leq p$) first unit transistor and a k-th second unit transistor included in each of the n comparators are arranged along the same straight line in the first direction, and
a channel length of each of the p first unit transistors and the p second unit transistors is shorter than ½ the cell pitch width.

5. The analog-digital converter of claim 3, wherein
p first unit transistors and p second unit transistors included in each of the n comparators are arranged so as not to be adjacent in the first direction to any of p first unit transistors and p second unit transistors included in another adjacent comparator.

6. The analog-digital converter of claim 2, wherein
in each of the n comparators, the p second unit transistors are arranged in point symmetry with the p first unit transistors with respect to a reference point within the cell pitch of the comparator.

7. The analog-digital converter of claim 6, wherein
a k-th ($1 \leq k \leq p$) first unit transistor and a k-th second unit transistor included in each of the n comparators are arranged along the same straight line in the first direction, and
a channel length of each of the p first unit transistors and the p second unit transistors is shorter than the cell pitch width.

8. The analog-digital converter of claim 6, wherein
p first unit transistors and p second unit transistors included in each of the n comparators are arranged so as not to be adjacent in the first direction to any of p first unit transistors and p second unit transistors included in another adjacent comparator.

9. The analog-digital converter of claim 1, wherein
the p first unit transistors have the same channel length, and
the p second unit transistors have the same channel length.

10. The analog-digital converter of claim 1, wherein
the p first unit transistors have different channel lengths, and
the p second unit transistors have different channel lengths.

11. The analog-digital converter of claim 1, wherein
each of the n comparators further includes a current source transistor for supplying a reference current to the first and second differential transistors, and
the current source transistor is formed by a plurality of unit transistors connected in series whose gates are given a bias voltage for supplying the reference current.

12. The analog-digital converter of claim 1, further comprising
n amplifiers arranged in the first direction with a predetermined cell pitch and corresponding respectively to the n input voltages, each amplifier amplifying the input voltage corresponding to the amplifier and supplying the amplified input voltage to the comparator corresponding to the amplifier, wherein
each of the n amplifiers includes a current source transistor for supplying a predetermined current, and
the current source transistor included in each of the n amplifiers is formed by a plurality of unit transistors connected in series whose gates are given a bias voltage for supplying the predetermined current.

13. An image sensor system comprising:
n×m pixel portions arranged in a two-dimensional matrix of n columns by m rows, each pixel portion generating a charge according to an amount of incident light thereupon;
a vertical scanning circuit for selecting the n×m pixel portions row by row;
n readout circuits corresponding respectively to n pixel columns of the n×m pixel portions, each readout circuit generating a pixel voltage according to the charge generated by one of the n pixel portions selected by the vertical scanning circuit that corresponds to the readout circuit;
the analog-digital converter of claim 1 for converting the n pixel voltages generated by the n readout circuits to n digital values; and
a horizontal scanning circuit for successively transferring the n digital values obtained by the analog-digital converter as captured data.

14. The image sensor system of claim 13, wherein
each of the n readout circuits includes a current source transistor which forms a source follower circuit together with a pixel portion corresponding to the readout circuit, and
the current source transistor included in each of the n readout circuits is formed by a plurality of unit transistors connected in series whose gates are given a reference voltage for supplying a readout current.

15. A camera device comprising:
the image sensor system of claim 13; and
a data processing circuit for processing the captured data transferred from the image sensor system.

* * * * *